(12) United States Patent
Bookbinder et al.

(10) Patent No.: US 7,506,521 B2
(45) Date of Patent: *Mar. 24, 2009

(54) HIGH TRANSMISSION SYNTHETIC SILICA GLASS AND METHOD OF MAKING SAME

(75) Inventors: Dana Craig Bookbinder, Corning, NY (US); Richard Michael Fiacco, Corning, NY (US); Kenneth Edward Hrdina, Horseheads, NY (US); Lisa Anne Moore, Corning, NY (US); Susan Lee Schiefelbein, Ithaca, NY (US)

(73) Assignee: Corning Incorporated, Corning, NY (US)

( * ) Notice: Subject to any disclaimer, the term of this patent is extended or adjusted under 35 U.S.C. 154(b) by 720 days.

This patent is subject to a terminal disclaimer.

(21) Appl. No.: 11/148,504

(22) Filed: Jun. 8, 2005

(65) Prior Publication Data

US 2006/0137397 A1 Jun. 29, 2006

Related U.S. Application Data

(60) Provisional application No. 60/640,726, filed on Dec. 29, 2004.

(51) Int. Cl.
*C03B 20/00* (2006.01)
*C03C 3/06* (2006.01)

(52) U.S. Cl. .................... 65/17.3; 65/17.4; 65/32.1; 501/53; 501/54

(58) Field of Classification Search ............... 501/54, 501/53; 65/17.3, 17.4, 32.1
See application file for complete search history.

(56) References Cited

U.S. PATENT DOCUMENTS

| 5,086,352 | A | 2/1992 | Yamagata et al. | 359/350 |
|---|---|---|---|---|
| 5,211,732 | A | 5/1993 | Abbott et al. | 65/421 |
| 5,325,230 | A | 6/1994 | Yamagata et al. | 359/350 |
| 5,410,428 | A | 4/1995 | Yamagata et al. | 359/350 |
| 5,616,159 | A | 4/1997 | Araujo et al. | 65/174 |
| 6,143,676 | A * | 11/2000 | Ohashi et al. | 501/54 |
| 6,451,719 | B1 * | 9/2002 | Yamagata | 501/54 |
| 6,606,883 | B2 | 8/2003 | Hrdina et al. | 65/174 |
| 6,698,248 | B2 | 3/2004 | Marley et al. | 65/413 |
| 2003/0115905 | A1 | 6/2003 | Kuhn et al. | 65/176 |
| 2003/0139277 | A1 | 7/2003 | Maxon et al. | 501/54 |

FOREIGN PATENT DOCUMENTS

| CA | 2079699 A | * | 4/1994 |
| JP | 02-080343 A | * | 3/1990 |
| JP | 06-234545 A | * | 8/1994 |
| JP | 2001-146434 A | * | 5/2001 |

OTHER PUBLICATIONS

Escher, G.C., Krf Laser Induced Color Centers In Commercial Fused Silicas, SPIE vol. 998, Excimer Beam Applications, pp. 30-37 (1999), no month.
Yamagata, S., Improvement of Excimer Laser Durability of Silica Glass, Transactions of the Materials Research Society of Japan, vol. 8, pp. 82-96 (1992), no month.
Faile, S. P., and Roy, D. M., *Mechanism of Color Center Destruction in Hydrogen Impregnated Radiation Resistant Glasses*, Materials Research Bull., vol. 5, pp. 385-390 (1970), no month.
Shelby, J. E., *Radiation Effects in Hydrogen-impregnated Vitreous Silica*, J. Applied Physics, vol. 50, No. 5, pp. 3702-3706 (1979), no month.
Agarwal et al., *A simple IR spectroscopic method for determining fictive temperature of silica glasses*, Journal of Non-crystalline Solids 185 (1995) 191, no month.
V. S. Khotimchenkô et al., Prikladnoi Spektroskopii, 46 (6), 987-997 (1986), no month.

* cited by examiner

*Primary Examiner*—Anthony J Green
(74) *Attorney, Agent, or Firm*—Robert P. Santandrea; Siwen Chen

(57) ABSTRACT

Disclosed are high purity synthetic silica material having an internal transmission at 193 nm of at least 99.65%/cm and method of preparing such material. The material is also featured by a high compositional homogeneity in a plane transverse to the intended optical axis. The soot-to-glass process for making the material includes a step of consolidating the soot preform in the presence of $H_2O$ and/or $O_2$.

47 Claims, 16 Drawing Sheets

HIGH TRANSMISSION SYNTHETIC SILICA GLASS AND METHOD OF MAKING SAME

CROSS-REFERENCE TO RELATED APPLICATIONS

The present invention claims priority of U.S. Provisional Patent Application Ser. No. 60/640,726, entitled "HIGH TRANSMISSION SYNTHETIC SILICA GLASS AND METHOD OF MAKING SAME," filed on Dec. 29, 2004, the content of which is incorporated herein by reference in its entirety.

FIELD OF THE INVENTION

The present invention relates to fused silica material and process of making the same. In particular, the present invention relates to high purity synthetic fused silica material having high transmission at 193 nm and methods of making the same. The present invention is useful, for example, in producing high purity synthetic fused silica materials for optical members used in applications operating in deep and vacuum UV regions.

BACKGROUND OF THE INVENTION

As practiced commercially, fused silica optical members such as lenses, prisms, filters, photomasks, reflectors, etalon plates and windows, are typically manufactured from bulk pieces of fused silica made in large production furnaces. Bulk pieces of fused silica manufactured in large production furnaces are known in the art as boules or ingots. Blanks are cut from boules or ingots, and finished optical members are manufactured from glass blanks, utilizing manufacturing steps that may include, but are not limited to, cutting, polishing, and/or coating pieces of glass from a blank. Many of these optical members are used in various apparatus employed in environments where they are exposed to ultraviolet light having a wavelength of about 360 nm or less, for example, an excimer laser beam or some other ultraviolet laser beam. The optical members are incorporated into a variety of instruments, including lithographic laser exposure equipment for producing highly integrated circuits, laser fabrication equipment, medical equipment, nuclear fusion equipment, or some other apparatus which uses a high-power ultraviolet laser beam.

As the energy and pulse rate of lasers increase, the optical members which are used in conjunction with such lasers, are exposed to increased levels of laser radiation. Fused silica members have become widely used as the manufacturing material of choice for optical members in such laser-based optical systems due to their excellent optical properties and resistance to laser induced damage.

Laser technology has advanced into the short wavelength, high energy ultraviolet spectral region, the effect of which is an increase in the frequency (decrease in wavelength) of light produced by lasers. Of particular interest are short wavelength excimer lasers operating in the UV and deep UV (DUV) and vacuum UV wavelength ranges, which includes, but are not limited to, lasers operating at about 248 nm, 193 nm, 157 nm and even shorter wavelengths. Excimer laser systems are popular in microlithography applications, and the shortened wavelengths allow for increased feature resolution and thus line densities in the manufacturing of integrated circuits and microchips, which enables the manufacture of circuits having decreased feature sizes. A direct physical consequence of shorter wavelengths (higher frequencies) is higher photon energies in the beam due to the fact that each individual photon is of higher energy. In such excimer laser systems, fused silica optics are exposed to high energy photon irradiation levels for prolonged periods of time resulting in the degradation of the optical properties of the optical members.

It is known that such laser induced degradation adversely affects the optical properties and performance of the fused silica optics by decreasing light transmission levels, discoloring the glass, altering the index of refraction, altering the density, and increasing absorption levels of the glass. Over the years, many methods have been suggested for improving the optical damage resistance of fused silica glass. It has been generally known that high purity fused silica prepared by such methods as flame hydrolysis, CVD-soot remelting process, plasma CVD process, electrical fusing of quartz crystal powder, and other methods, are susceptible to laser damage to various degrees.

A common suggestion has been to increase the OH content of such glass to a high level. For example, Escher, G. C., *KrF Laser Induced Color Centers In Commercial Fused Silicas,* SPIE Vol. 998, Excimer Beam Applications, pp. 30-37 (1988), confirms that defect generation rate is dependent upon the fused silica OH content, and that "wet" silica is the material of choice for KrF applications. Specifically, they note that high OH content silica is more damage resistant than low OH silica.

U.S. Pat. No. 5,086,352 and the related U.S. Pat. No. 5,325, 230 have also disclosed that the ability to resist optical deterioration from exposure to a short wavelength ultraviolet laser beam depends on the OH group content in the presence of hydrogen gas. Specifically, these references show that for high purity silica glass having low OH content, KrF excimer laser durability is poor. Thus, they suggest an OH content of at least 50 ppm. Similarly, Yamagata, S., *Improvement of Excimer Laser Durability of Silica Glass,* Transactions of the Materials Research Society of Japan, Vol. 8, pp. 82-96 (1992), discloses the effect of dissolved hydrogen on fluorescence emission behavior and the degradation of transmission under irradiation of KrF excimer laser ray for high purity silica glass containing OH groups to 750 ppm by weight such as those synthesized from high purity silicon tetrachloride by the oxygen flame hydrolysis method.

Others have also suggested methods of increasing the optical durability of fused silica. For example, Faile, S. P., and Roy, D. M., *Mechanism of Color Center Destruction in Hydrogen Impregnated Radiation Resistant Glasses,* Materials Research Bull., Vol. 5, pp. 385-390 (1970), have disclosed that hydrogen-impregnated glasses tend to resist gamma ray-induced radiation. Japanese Patent Abstract 40-10228 discloses a process by which quartz glass article made by melting, is heated at about 400 to 1000° C. in an atmosphere containing hydrogen to prevent colorization due to the influence of ionizing radiation (solarization). Similarly, Japanese Patent Abstract 39-23850 discloses that the transmittance of UV light by silica glass can be improved by heat treating the glass in a hydrogen atmosphere at 950 to 1400° C. followed by heat treatment in an oxygen atmosphere at the same temperature range.

Shelby, J. E., *Radiation Effects in Hydrogen-impregnated Vitreous Silica,* J. Applied Physics, Vol. 50, No. 5, pp. 3702-06 (1979), suggests that irradiation of hydrogen-impregnated vitreous silica suppresses the formation of optical defects, but that hydrogen impregnation also results in the formation of large quantities of bound hydroxyl and hydride, and also results in the expansion or decrease in density of the glass.

Recently, U.S. Pat. No. 5,410,428 has disclosed a method of preventing induced optical degradation by a complicated combination of treatment processes and compositional manipulations of the fused silica members to achieve a particular hydrogen concentration and refractive index, in order to improve resistance to UV laser light degradation. It is suggested that under such UV irradiation the chemical bonding between silicon and oxygen in the network structure of the fused silica is generally broken and then rejoins with other structures resulting in an increased local density and an increased local refractive index of the fused silica at the target area.

More recently, U.S. Pat. No. 5,616,159 to Araujo et al., disclosed a high purity fused silica having high resistance to optical damage up to $10^7$ pulses (350 mJ/cm$^2$/pulse) at the laser wavelength of 248 nm and a method for making such glass. The composition disclosed in Araujo et al. comprises at least 50 ppm OH and $H_2$ concentrations of greater then $1 \times 10^{18}$ molecules/cm$^3$.

While the above suggested methods are at least partially effective in reducing the absorption induced at 215 and 260 nm, there has been little or no suggestion for addressing optical damage caused by radiation-induced compaction resulting from prolonged exposure to eximer lasers. Furthermore, given the semiconductor industry's reliance on excimer lasers and materials that transmit that energy to make integrated circuit chips and other products and the constant drive towards decreased line width and the necessary wavelength of the incident light and the resultant increase in the laser energy level, it follows that the fused silica material requirements become much more stringent. As such, there continues to be a need for more improved fused silica glasses, particularly fused silica material which is as inert as possible with respect to the incident light energy and thus exhibiting increased resistance to optical damage during prolonged exposure to ultraviolet laser radiation, in particular, resistance to optical damage associated with prolonged exposure to UV radiation caused by 193 and 248 nm excimer lasers.

It is important that the fused silica materials used as an element in the light path in precision optical devices and applications have high refractive index homogeneity. However, unfortunately, depending on the method of production of the fused silica material, refractive index variation in the materials along the light path and transverse to the light path, tend to occur. Such refractive index variation can lead to striae in the materials. The variation may be present in the short range and/or in the long range. Irregular and unpredictable refractive index variation in the direction perpendicular to the optical axis (radial direction) is particularly detrimental and undesirable. Therefore, measures have to be taken in the production of fused silica materials to improve the refractive index homogeneity.

In the prior art, various methods have been disclosed and suggested to improve the refractive index homogeneity of the fused silica glass boule produced. For example, United States Patent Application Publication No. 2003/0,139,277 A1 discloses that doping aluminum into the fused silica boule can improve the axial refractive index homogeneity. U.S. Pat. No. 6,698,248 discloses an improved furnace design where the distance between the burners and the soot collecting surface remains substantially constant that enhances the axial refractive index homogeneity of the fused silica boule produced in the furnace. Other methods such as oscillating the soot collecting surface have been disclosed and used in the commercial production of fused silica boule in order to improve the refractive index homogeneity, in addition to other optical and physical properties.

However, all these approaches were adopted in the context of producing fused silica boules in a direct-deposit furnace exemplified in FIG. 1 of United States Patent Application Publication No. 2003/0,139,277. In a direct-deposit furnace, silica soot particles produced or provided are collected at a high temperature on a collecting surface, where they are consolidated to form a transparent fused silica boule. Therefore, in this fused silica production process, soot particle deposition and consolidated glass formation are carried out in a single step in a single furnace.

Another approach of forming fused silica glass body involves a two step process. First, silica soot particles are formed and deposited on a soot collecting surface to form a porous silica body. In a second step, after optional further treatment, the porous silica body is consolidated into a transparent glass body by sintering at a high temperature. Unique issues relating to the control of refractive index uniformity in this process have arisen. For example, it has been discovered that the refractive index in a plane transverse to the optical axis may vary to an unacceptable level. In addition, producing synthetic silica materials having a high transmission at 193 nm using this method is a great technological challenge as well.

Therefore, there exists a need for an improved process for producing high purity synthetic silica materials and such materials having improved optical performance per se. The present invention satisfies this need.

SUMMARY OF THE INVENTION

According to one aspect of the present invention, it is provided a process for making a synthetic glass material with an OH concentration from 0.1 to 1300 ppm by weight with a variation in OH concentration in a plane perpendicular to at least one axis thereof of less than 10 ppm by weight, comprising the following steps:
  (i) providing high purity silica soot particles;
  (ii) forming a porous preform having bulk density of 0.2 to 1.6 g/cm$^3$ from the soot particles;
  (iii) optionally purifying the porous preform; and
  (iv) consolidating the preform into dense silica in the presence of $H_2O$ and/or $O_2$ in a furnace having an internal surface exposed to the consolidation atmosphere which is inert to $H_2O$ and $O_2$.

In a preferred embodiment of the process of the present invention, in step (ii), the porous preform deposited has a bulk density between 0.25 to 1.0 g/cm$^3$.

According to another preferred embodiment of the process of the present invention, in step (ii), the porous preform deposited has a local soot density variation of less than 20% of the average overall bulk density of the preform over a distance of more than 2 mm in a plane perpendicular to an axis thereof. Preferably, in step (ii), the porous preform deposited has, over a distance over 0.2 mm, an initial local soot density variation measured in a plane perpendicular to the intended optical axis of the consolidated glass of less than 20% of the average bulk density of the soot preform, or less than 0.2 g/cm$^3$, whichever is greater. Preferably, in step (ii), the porous preform deposited has, over a distance over 0.2 mm, an initial local soot density variation measured in a plane perpendicular to the intended optical axis of the consolidated glass of less than 10% of the average bulk density of the soot preform, or less than 0.1 g/cm$^3$, whichever is greater.

In a preferred embodiment of the process of the present invention, in step (iv), the preform is subjected to a temperature elevation rate of less than 0.4° C./minute between 1150-1450° C. More preferably, in step (iv), the preform is subjected to a temperature elevation rate of less than 0.4° C./minute between 1000-1600° C. Still more preferably, in step (iv), the preform is subjected to a temperature rate of less than 0.2° C./minute between 1150-1450° C. Still more preferably, in step (iv), the preform is first isothermally held at a temperature between 1150° C. and 1300° C. for at least one hour prior to final densification. Still more preferably, in step (iv), the preform is first isothermally held at a temperature between 1150° C. and 1300° C. for more than 5 hours, but less than 200 hours.

In a preferred embodiment of the process of the present invention, in step (iv), the preform is consolidated in an atmosphere comprising helium and/or argon. In a preferred embodiment, in step (iv), the preform is consolidated in an atmosphere comprising less than 1% by volume of $O_2$. More preferably, in step (iv), the preform is consolidated in an atmosphere comprising less than 0.4% by volume of $O_2$. In another preferred embodiment, in step (iv), the preform is subjected to an atmosphere containing $O_2$ at least before the temperature is elevated to 1200° C.

In another preferred embodiment of the process of the present invention, in step (iv), the preform is consolidated in an atmosphere comprising $H_2O$. Preferably, in step (iv), the partial pressure of $H_2O$ in the consolidation atmosphere is between about 0.0005 to 760 torr, more preferably between about 1 and 10,000 ppm by volume, still more preferably between 10 and 3,000 ppm. In addition to $H_2O$, the consolidation atmosphere may comprise $O_2$ as well.

Preferably, in step (iv), the preform is consolidated in an environment substantially inert to $O_2/H_2O$. Preferably, at least the furnace muffle is constructed with material inert to $O_2/H_2O$ under the consolidation conditions. More preferably, the whole furnace surfaces exposed to the consolidation atmosphere under the consolidation conditions are constructed with material inert to $O_2/H_2O$ under the consolidation conditions. Preferred such materials inert to $O_2$ and $H_2O$ under the consolidation conditions include, but are not limited to, silica, alumina ($Al_2O_3$), zirconia ($ZrO_2$), zircon ($ZrO_2 \cdot SiO_2$), SiN, SiC, and combinations thereof.

In one embodiment of the process of the present invention, in step (ii), the soot particles are deposited axially on a rotating support to form the preform. Preferably, step (ii) comprises the following steps:

(A) depositing the soot particles axially on the rotating support to form a cylinder having a cladding layer formed of the soot particles;

(B) removing the support from the cylinder to leave the cladding layer, which forms the preform.

In this embodiment, there may be an additional step (v) after step (iv): further comprising the following step (v) after step (iv):

(v) with optional cutting, rolling and/or sagging the consolidated glass into planar form.

In another embodiment of the process of the present invention, in step (ii), the soot particles are deposited on a substantially planar surface of a rotating substrate.

According to a second aspect of the present invention, it is provided a synthetic silica glass material with an OH concentration from 0.1 to 1300 ppm by weight with a variation in OH concentration measured across a cross-section perpendicular to at least one axis thereof of less than 20 ppm by weight, preferably less than 10 ppm by weight, more preferably less than 5 ppm by weight, and an internal transmission at 193 nm of at least 99.65%/cm, preferably at least 99.70%/cm, more preferably at least 99.75%/cm, most preferably at least 99.80%/cm. Desirably, the synthetic silica glass of the present invention has a refractive index variation in a cross-section perpendicular to the optical axis thereof of less than 5 ppm, preferably less than 2 ppm, more preferably less than 1 ppm. In one embodiment of the synthetic glass material of the present invention, the material comprises striae along the axis. Such straie are preferably essentially parallel to the planes perpendicular to the axis described above in this paragraph. In those different layers of striae, the average OH concentration and refractive index may differ slightly within an acceptable range.

Preferably, the synthetic silica glass material of the present invention further comprises between $1 \times 10^{15}$ to $5 \times 10^{18}$ molecules/$cm^3$ $H_2$. Preferably, the synthetic silica glass material of the present invention comprises $O_2$ in an amount less than $7.5 \times 10^{16}$ molecules $O_2/cm^3$, more preferably less than $3.7 \times 10^{16}$ molecules $O_2/cm^3$, still more preferably less than $1.8 \times 10^{16}$ molecules/$cm^3$.

Preferably, the synthetic silica glass material of the present invention comprises less than 50 ppm by weight of Cl. Preferably, the synthetic silica glass material of the present invention has an OH concentration between 0.1-400 ppm by weight, more preferably between 0.1-100 ppm by weight. Preferably, the synthetic silica glass material of the present invention has less than 10 ppb alkali, alkaline earth, or transition metal elements. More preferably, the synthetic silica glass material of the present invention comprises less than 1 ppb alkaline earth or transition metal elements. Preferably, the synthetic silica glass material of the present invention has a fictive temperature between 800-1200° C. and less than 50° C. variation in fictive temperature and more preferably less than 10° C. variation in fictive temperature. Preferably, the synthetic silica glass of the present invention has a birefringence of less than 2 nm/cm, more preferably less than 1 nm/cm, still more preferably less than 0.5 nm/cm. Preferably, the synthetic silica glass material of the present invention further comprises fluorine. A desirable fluorine concentration range is from 1 to 5000 ppm by weight, preferably from 1 to 2000 ppm.

A third aspect of the present invention is a glass optical member made of the synthetic silica glass material of the present invention, said optical member having an optical axis parallel to the axis perpendicular to which the silica glass material has a variation of OH concentration of less than 20 ppm by weight. Preferably, the optical member is for use in lithography at shorter than about 250 nm.

The high purity fused silica glass material of present invention has the following advantages: (I) high refractive index homogeneity in directions perpendicular to the optical axis, thus a large clear aperture area; (II) high transmission at short wavelength such as below about 250 nm, especially at about 193 nm; and (III) low birefringence; (IV) low level of, or substantially no oxygen-deficient absorption centers; and (V) low laser induced wavefront distortion when subjected to high energy UV laser irradiation. Therefore, the silica glass of the present invention is particularly useful for the production microlithography applications in the deep UV and vacuum UV regions.

The process of the present invention for the production of high purity synthetic fused silica material does not require the costly and complex mechanical homogenization step of the consolidated glass at very high temperatures. The process is relatively easy to control. The yield of the process can be very high and consistency between different runs can be achieved.

Additional features and advantages of the invention will be set forth in the detailed description which follows, and in part will be readily apparent to those skilled in the art from the description or recognized by practicing the invention as described in the written description and claims hereof, as well as the appended drawings.

It is to be understood that the foregoing general description and the following detailed description are merely exemplary of the invention, and are intended to provide an overview or framework to understanding the nature and character of the invention as it is claimed.

The accompanying drawings are included to provide a further understanding of the invention, and are incorporated in and constitute a part of this specification.

BRIEF DESCRIPTION OF THE DRAWINGS

In the accompanying drawings.

DETAILED DESCRIPTION OF THE INVENTION

Figure 1:
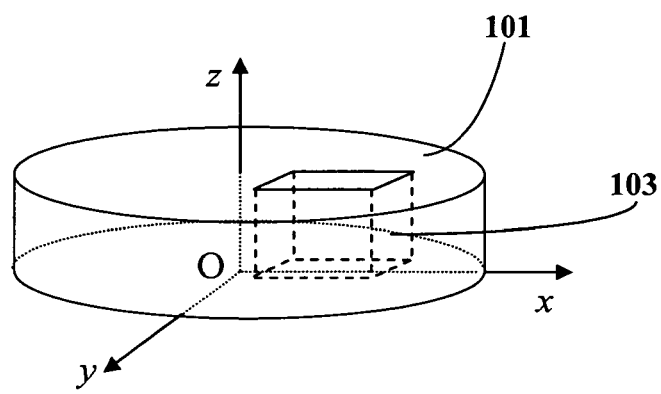
FIG. 1 is a schematic illustration of a piece or a blank of the silica glass material in a xyz orthogonal coordinate system.

As used herein, the term "variation of refractive index," or "refractive index variation," or "Δn," means the maximal variation of refractive indices measured in a plane perpendicular to the optical axis of the glass material or glass optical member along a predetermined direction by using interferometry at about 633 nm (He—Ne laser). As is typically done by one skilled in the art, when discussing refractive index variation along a certain direction, tilt and piston are subtracted. Therefore, the refractive index variation along a certain direction (such as the radial direction in a sample prepared by using the OVD process) in the meaning of the present application does not include tilt or piston. As indicated below, typically, the optical axis of a glass optical member, a glass blank, or a piece of glass material, is selected to be perpendicular to a plane (a cross-section) in which the measured refractive index inhomogeneity is the smallest, in order to obtain a glass member having large clear aperture area. FIG. 1 in the drawings of the present invention schematically illustrates a piece or a blank of the material of the present invention in a xyz orthogonal coordinate system. The blank 101 has an optical axis z. The plane xOy, perpendicular to axis z, intersects the blank 101 to obtain a cross-section of the blank. When measuring refractive index homogeneity, the sample taken (for example, the sample 103 indicated in FIG. 1) has a uniform thickness. When measured across the cross-section, the variation of refractive index in the desired direction (such as the radial direction of a sample prepared by using the OVD process, or the x direction as illustrated in FIG. 1), with tilt and piston taken out, is less than 5 ppm, preferably less than 2 ppm, more preferably less than 1 ppm. Desirably, the variation of refraction index in both the x and y directions, measured separately, with tilt and piston taken out, is less than 5 ppm, preferably less than 3 ppm, most preferably less than 1 ppm.

The birefringence of the glass is measured by a polarimeter at a wavelength of 633 nm (He—Ne laser) in accordance with methods well established in the art, using, for example, commercially available instruments specifically designed for measuring birefringence.

Parameters such as β-OH in the glass, OH amount in ppm by weight, variation of OH concentration in the glass, and fictive temperature of the glass can be typically derived from the measurement of infrared transmittance of the glass. The wavelength range of interest is 2-5 μm (wave number range 5000 $cm^{-1}$ to 2000 $cm^{-1}$). A conventional infrared spectrophotometer, either an FT-IR (Fourier transform infrared) spectrometer or a dispersive infrared spectrophotometer, may be employed. For high spatial resolution measurements, such as for variation of OH concentration, additional equipment may be used as is known in the art.

The OH group has characteristic absorption bands near 2.72 μm (3676 $cm^{-1}$), 2.21 μm (4525 $cm^{-1}$) and 1.38 μm (7246 $cm^{-1}$) in fused silica. The $H_2$ species has an absorption band at 2.38 μm (4135 $cm^{-1}$) in fused silica.

The parameter β-OH is defined as the relative linear absorption coefficient of hydroxyl (OH) in a glass matrix, or the absorption per unit pathlength. It is calculated using the following equation:

$$\beta - OH = \frac{1}{t} \log \frac{T_{ref}}{T_{OH}}$$

where:
$T_{ref}$=Transmittance of sample at reference position, a non-absorbing wavelength such as 4000 $cm^{-1}$;
$T_{OH}$=Transmittance of sample at OH absorption peak (~3676 $cm^{-1}$ for silica); and
t=Thickness of sample (mm).

This β-OH value is linearly proportional to the hydroxyl concentration.

The OH concentration, c, in mol·$liter^{-1}$, is derived from the Beers-Lambert Law $$A = \epsilon \cdot c \cdot b$$

where the absorbance A=log ($T_{ref}/T_{OH}$), ε is the molar absorptivity in liter·$mol^{-1}$·$cm^{-1}$, c is concentration in mol·$liter^{-1}$, and b is the pathlength (sample thickness) in cm.

$$c(\text{mol·liter}^{-1}) = A/(\epsilon \cdot b)$$

Concentration of OH in ppm by weight can thus be calculated from c in mol·$liter^{-1}$ using the density of the glass and molecular weight of OH. The constant ε for high purity silica glass at a particular wavelength is available in the prior art.

Fictive temperature is a temperature at which a frozen-in glass structure would be at equilibrium. The Si—O—Si bond angle is a function of fictive temperature. The infrared absorption wavelength, or frequency, of Si—O—Si species varies with bond angle. Thus infrared absorption can be used to determine an approximate fictive temperature. An empirical relation between fictive temperature and absorption frequency is given in the prior art such as Agarwal et al., *A simple IR spectroscopic method for determining fictive temperature of silica glasses,* Journal of Non-crystalline Solids 185 (1995) 191. Raman scattering can also be used to determine fictive temperature using the scattering frequency of silica defects related to strained ring structure.

The preferred method for determination of interstitial molecular $H_2$ in fused silica is Raman scattering. Raman spectrometry is obtained using a T64000 spectrometer from HORIBA Jobin Yvon Inc. with an EEV charge-coupled device (CCD) detector. The hydrogen molecule concentration in molecules/cm$^3$ was obtained from the ratio of the intensity detected from the hydrogen molecule scattering peak at 4135 cm$^{-1}$ ($I_{4135}$) to the intensity of the silica scattering peak at 800 cm$^{-1}$ ($I_{800}$), i.e. $I_{4135}/I_{800}$, in the laser Raman spectrum (See, V. S. Khotimchenkô et al., Prikladnoi Spektroskopii, 46 (6), 987-997 (1986)). More specifically, the intensities of the peaks were determined by integrating the areas under the peaks using a linear or quadratic fit to the background. It should be noted that in the present method, the limit of detection was $1 \times 10^{16}$ molecules/cm$^3$.

Absolute β-OH values are obtained by the FTIR method described above. The measurements are typically through very thin pieces of glass of about 1 mm thickness. The variation of OH concentration means the differences in values of OH concentration measured in a certain direction in a cross-section. Similar to the definition of refractive index variation above, when discussing variation of OH concentration along a certain direction, linear changes are subtracted. Variation of OH concentration in the present application is defined as the maximal deviation of the measured data from a linear fit curve of the data. For a cylindrical sample prepared by using the OVD process, calculation of variation of OH concentration in the radial direction can be approximately illustrated as follows. The sample for measurement of OH concentration is schematically illustrated as 103 in FIG. 1.

For a data set containing N data points, such that at any radial location, $r_i$, the hydroxyl concentration is given by $OH_i$, where $i = 1, 2, 3, \ldots, N-1, N$. The data set can be fitted to a linear function of the form:

$$(OH)_{fit,i} = mr_i + c \quad [1]$$

where parameters m and c are estimated using the following relations:

$$m = \frac{\left[ \sum_{i=1}^{N} OH_i \sum_{i=1}^{N} r_i - N \sum_{i=1}^{N} OH_i r_i \right]}{\left[ \left( \sum_{i=1}^{N} r_i \right)^2 - N \sum_{i=1}^{N} r_i^2 \right]} \quad [2]$$

$$c = \frac{\left[ \sum_{i=1}^{N} OH_i - m \sum_{i=1}^{N} r_i \right]}{N} \quad [3]$$

The above relation are then used to estimate the maximum deviation of the data from the linear fit curve using the following relation:

$$(\Delta OH)_{max} = \max[abs(OH_i - mr_i - c)] \text{ for } i = 1, 2, 3, \ldots, N \quad [4]$$

For any glass blank, the same method of calculating OH concentration variation along a given direction in a cross-section perpendicular to the optical axis of a glass sample can be used mutatis mutandis. Still take sample 103 in FIG. 1 for example, the OH concentration variation as a function of the x coordinates (along the direction of axis x) in the cross-section parallel to the plane xOy can be calculated using the above least-square fitting of measured OH concentration data. Desirably, along directions of both the axes x and y, the OH concentration variation, measured separately, is less than 20 ppm, preferably less than 10 ppm, more preferably less than 5 ppm, still more preferably less than 3 ppm, most preferably less than 1 ppm.

The variation of fictive temperature of the glass material, or a blank or an optical member made therefrom, is the variation between the values measured throughout the bulk of the material.

Concentrations of Cl and F in the present invention are measured using the conventional microprobe technology available in the art. Concentrations of Na, K, and other metals in the present invention are measured using the conventional ICP/MS available in the art. The concentrations of Cl and fluorine are typically discussed in terms of ppm by weight. The concentrations of metals are usually described in terms of ppb by weight.

Local soot density as used herein denotes the bulk density of the soot preform in a small confined volume in a given location in the soot preform. The denser the soot particles are packed in a given small volume, the higher the local density and thus the lower the porosity in the volume. For the purpose of the present invention, "a high local soot density uniformity" means in a distance over 0.2 mm, the difference between the maximum and minimum local soot density measured in a plane perpendicular to the optical axis of the consolidated glass to be produced is less than 20% of the overall bulk soot density in the soot preform, or less than 0.2 g/cm$^3$, whichever is greater. Preferably, in a distance over 0.2 mm, the difference between the maximum and minimum local soot density is less than 10% of the overall bulk soot density in the soot preform, or less than 0.1 g/cm$^3$, whichever is greater. More preferably, in a distance over 0.2 mm, the difference between the maximum and minimum local soot density is less than 10% of the overall bulk soot density in the soot preform.

In the present application, $O_2/H_2O$ or $H_2O/O_2$ means $O_2$ or $H_2O$, or mixtures thereof with different proportions.

Laser-induced changes of optical behavior of high purity fused silica material have been extensively studied. Without intending to be bound by any particular theory, it is believed that the following photo-reactions may take place within the silica material when subjected to high energy photons such as those of KrF (248 nm) and ArF (193 nm) high-power pulsed laser:

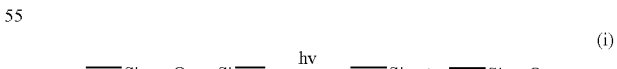

(i)

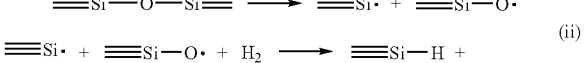

(ii)

(iii)

(iv)

In the above schematic illustrations of reactions, ≡Si—O• and ≡Si• are color centers. ≡Si• has an absorption peak at about 215 and thus is relevant to laser-induced absorption at 193 nm. It is believed that these reactions may lead to the induced absorption (transmission loss), density change, refractive index change (photorefraction), as well as stress-birefringence. The induced density change and refractive index change in combination contribute to the laser induced wave-front distortion (LIWFD). Such LIWFD can be wave-front retardation (expansion) and/or advancement (compaction). It has been observed that LIWFD is dependent upon the fluence and pulse number of the laser radiation. For the manufacturers of high precision optical systems, such as stepper lenses and UV scanners, such compaction and/or expansion, especially if non-linear or unpredictable, and laser induced transmission loss, are highly undesirable.

To date, two major processes are used for the production of high purity synthetic fused silica materials for use in optical applications. They are the soot-to-glass process and the direct-to-glass process. In the soot-to-glass process, silica soot particles are generated in a furnace and allowed to deposit on a rotating surface by, for example, outside vapor deposition (OVD) or vapor axial deposition (VAD), and the like, to form a porous soot preform. The soot preform is subsequently consolidated at a sintering temperature to form transparent consolidated high purity fused silica material. This method has been used widely in the production of optical fiber preforms. The direct-to-glass method usually involves forming silica soot particles at a temperature higher than that of the soot-to-glass method by flame hydrolysis and the like, and the soot particles are deposited onto the surface of a rotating table at such a high temperature (about 1650° C., for example) that they are consolidated into fused silica material in situ, usually in the same furnace where the soot particles are generated.

One of the advantages of the direct-to-glass process is the possibility of producing large fused silica boules at relatively high homogeneity, making it possible to make large blanks for use in large optical systems, such as stepper lenses. Due to difficulty in altering the many important, oftentimes intertwined process variables in the direct-to-glass method in order to produce a boule having the desired composition and optical properties, attention now has been directed to the production of high purity synthetic silica glass by using the soot-to-glass method, where the process conditions may be purposefully adjusted to alter the property of the final product.

Soot-to-glass methods for producing high purity synthetic fused silica materials have been described in the prior art before. For example, United States Patent Application Publication No. 2003/0115905 discloses a fused silica blank having an $H_2$ content in the range of $0.1 \times 10^{16}$ to $4.0 \times 10^{16}$ molecules/$cm^3$, an OH content in the range of 125 to 450 ppm by weight, an SiH group content of less than $5 \times 10^{16}$ molecules/$cm^3$, and a refractive index inhomogeneity of less than 2 ppm. It is disclosed in this reference that the soot-to-glass method was at least partly employed. However, it is clear from this reference that, in order to obtain the intended product, a post-sintering homogenization treatment is necessary. The homogenization treatment requires twisting and turning of the consolidated glass at a very high temperature, up to 2000° C., in special homogenization equipment. Such twisting and turning is described, for example, in European Patent Application Publication No. EP-A1 673 888. Therefore, it is clear that the silica glass prepared immediately after sintering but before the homogenization treatment according to United States Patent Application Publication No. 2003/0115905 does not have the required compositional and/or refractive index homogeneity required for many intended applications. However, as mentioned above, such high-temperature twisting and turning require the use of specialty equipment, and are very complex and costly to operate.

Surprisingly, the present inventors have produced high purity synthetic fused silica materials by using the soot-to-glass method without the need of a post-sintering homogenization treatment of the consolidated glass. The synthetic silica glass has the compositional and property, especially refractive index, homogeneity requirements in planes perpendicular to the optical axis of the glass. In addition, by using the soot-to-glass method of the present invention, the present inventors have successfully made high purity synthetic fused silica glass material having very high internal transmission at 193 nm of at least 99.65%/cm. Indeed many glasses thus produced have an internal transmission at 193 nm of higher than 99.75%/cm. Some glasses thus produced even have internal transmission higher than 99.80%/cm. The synthetic silica glass material per se constitutes a first aspect of the present invention. The silica glass of the present invention features an OH concentration variation of less than 20 ppm, preferably less than 10 ppm, most preferably less than 5 ppm measured in a plane perpendicular to the optical axis of the material. The glass may be further doped with chlorine, fluorine, and other dopants. Desirably, such other dopants are substantially homogeneously distributed in the same plane in which OH concentration variation meets the requirement described above. As a result of the compositional uniformity in such plane, the glass of the present invention has high refractive index homogeneity in the same plane. Desirably, Δn in the same plane is less than 5 ppm, preferably less than 2 ppm, more preferably less than 1 ppm.

In one embodiment of the synthetic glass material of the present invention, the material comprises striae along the axis. Such straie are preferably essentially parallel to the planes perpendicular to the optical axis. In those different layers of striae, the average OH concentration and refractive index may differ slightly within an acceptable range. For example, the difference of average OH concentration in different layers of the striae may be up to 150 ppm, preferably less than 100 ppm, more preferably less than 80 ppm, still more preferably less than 50 ppm, most preferably less than 20 ppm.

It should be noted that in the direction along the optical axis, different layers of glass having slightly differing average refractive indices and composition may exist in the form of, e.g., low spatial frequency variations or high spatial frequency variations (striae). Requirements as to composition and/or refractive index homogeneity in the direction along the optical axis is not as stringent as they are as to those in the planes perpendicular to the optical axis.

Because the presence of $H_2$ in proper amounts can function to inhibit the formation of oxygen-deficient centers in the glass and reduce the laser induced absorption and LIWFD, in some preferred embodiments of the glass of the present invention, the silica glass comprises $H_2$ in the amount between $1 \times 10^{15}$ to $5 \times 10^{18}$ molecules/$cm^3$.

The presence of chlorine, alkali metals, alkaline earth metals and transition metals all lead to transmission loss at 193 nm. Therefore, it is desired that chlorine level in the glass is controlled below 50 ppm, and the amount of alkali, alkaline earth and transition metals are all controlled at lower than 10 ppb, preferably lower than 1 ppb.

In order to reduce Rayleigh scattering at 193 nm inside the glass, it is desired that the glass material of the present invention has a low fictive temperature of between 800-1200° C. It is also desired that the glass of the present invention has a variation of fictive temperature less than 50° C. and preferably less than 10 C.

Another aspect of the present invention is an optical glass member made of the silica glass material of the present invention having an optical axis parallel to the axis of the material of the present invention, in a plane perpendicular to which the OH concentration variation is less than 20 ppm by weight. Desirably, the optical glass member of the present invention has an internal transmission at 193 mn of higher than 99.65%/cm, preferably higher than 99.70%/cm, more preferably higher than 99.75%/cm, most preferably higher than 99.80%/cm.

Still another aspect of the present invention is directed to the novel soot-to-glass method. In step (i) of the process, the soot particles are typically provided by a flame hydrolysis process of a silicon precursor compound. The silicon precursor compound, such as $SiCl_4$ and organosilicon compounds, for example, OMCTS (octamethylcyclotetrasiloxane) and the like, may be introduced into a flame of hydrogen, $CH_4$, and the like, burning with $O_2$, whereby silica soot is formed. Step (i) may be plasma-assisted. In order to produce silica glass having very high transmission over 99.80%/cm at 193 nm, it is desirable that the silica soot particles provided in step (i) are essentially free of metal contaminants and chlorine. To this end, high purity organosilicon precursors such as OMCTS may be used in the vapor deposition processes to provide the high purity soot particles. In step (ii), the silica soot may be deposited to form a porous body onto a rotating support (such as a mandrel), such as those in a typical outside vapor deposition (OVD) or a vapor axial deposition (VAD) process. If a mandrel is used, it is usually removed after deposition to result in a hollow cylindrical shaped porous soot body before the consolidation in step (iv). The porous soot body may be consolidated as is in step (iv) or with optional prior purification. Alternatively, the soot preform may be formed in accordance with the teaching of U.S. Pat. No. 6,606,883 to Hrdina et al., entitled "Method for Producing Fused Silica and Doped Fused Silica Glass," the content of which is relied upon and incorporated herein by reference in its entirety. According to this patent reference, flat, porous silica soot preforms can be formed by depositing silica soot particles on a planar surface. This preform deposition method is referred to as "planar deposition" in the present application. Advantageously, the planar deposition surface rotates and oscillates so that a more homogeneous soot preform body can be produced.

Regardless of the deposition method used, it is important that the local soot density of the preform produced in step (ii) is sufficiently homogeneous. The present inventors have discovered that initial local soot density prior to consolidation in the preform is one of the key factors determining the final compositional homogeneity, especially OH concentration homogeneity in the consolidated glass. Therefore, for the present invention, the local soot density variation in a distance over 0.2 mm in the preform, measured in a plane perpendicular to the intended optical axis of the consolidated glass, is required to be less than 20% of the overall bulk density of the whole soot preform, or less than 0.2 $g/cm^3$, whichever is greater. Preferably, the local soot density variation in a distance over 0.2 mm in the preform is less than 10% of the overall bulk density of the whole soot preform, or less than 0.1 $g/cm^3$, whichever is greater. In order to obtain a high initial local soot density uniformity, one method is to randomize the oscillation of burners in steps (i) and (ii) of the process of the present invention. Technique, strategy and equipment that can be used to improve the uniformity of soot deposition are disclosed, for example, in U.S. Pat. No. 5,211,732 to Abbott et al., the content of which is relied upon and incorporated herein by reference in its entirety.

Purification of the soot preform can be done using methods known in the art, such as chlorine treatment and the like. If the preform is formed by using a chlorine-containing silicon precursor compound, such as $SiCl_4$, or if the preform is purified using chlorine, it may be desired to strip the preform of chlorine before consolidation. Chlorine stripping can be done using various types of gases, including, but not limited to, $O_2$, $H_2O$, fluorine-containing compounds, Br-containing compounds, and the like, and compatible mixtures and combinations thereof. The present inventors have conducted a systematic study of the efficacy of various purification agents in stripping contaminants such as Ti, Fe, Na, K, and the like. The present inventors also systematically studied a series of chlorine stripping agents and efficacy thereof. Details of the studies and results are provided below.

The consolidation (sintering) step (iv) is usually carried out in the presence of an inert gas, such as helium and/or argon. To obtain silica glass having relatively high OH concentration, for example, over 50 ppm, it is desired to consolidate the soot preform in the presence of $H_2O$. As discussed below, the final OH concentration in the silica glass is partly determined by the partial pressure of $H_2O$ in the consolidation atmosphere. Step (iv) of the process of the present invention requires the presence of $H_2O$ and/or $O_2$ in the consolidation atmosphere. As discussed below, $H_2O$ is a very good chlorine stripping agent under the consolidation conditions. $O_2$ also can function to strip chlorine from the preform. The present inventors have discovered that the presence of $H_2O$ and/or $O_2$ in the consolidation atmosphere is important for the desired high level of internal transmission of at least 99.65%/cm. Without intending to be bound by any particular theory, the present inventors believe this is because, in addition to chlorine stripping, $H_2O/O_2$ also helps to suppress the formation of oxygen-deficient centers in the glass during consolidation. However, it is not excluded that the consolidation may be carried out in the presence of other gas, such as $H_2$, fluorine-containing compounds, and the like.

The temperature-temporal profile of the furnace in which the preform is consolidated is critical to the quality of the consolidated glass. The temperature elevation rate is an important process lever for controlling the final compositional profile in the consolidated glass. Generally, consolidating at too low a temperature, such as 1200° C., albeit theoretically possible, is not practical because it takes too long for the glass to completely consolidate. At higher temperature, consolidation is faster. For example, at 1650° C., soot particles produced in the direct-to-glass furnaces are consolidated in situ into fused silica glass. However, if the temperature elevation rate is too high during consolidation (sintering), temperature gradient in the glass tends to exist, leading to composition gradient in the soot preform and differing sintering rate in different areas in the preform, which, in turn, causes additional composition gradient, and hence refractive index variation in the consolidated glass. At a low temperature elevation rate, temperature gradient throughout the soot preform and between the preform and the atmosphere are less likely to occur or are smaller if present, causing the atmosphere to equilibrate with soot particles throughout the preform. This is especially important for an even distribution of $H_2O$ in the soot preform. It has been found that uniform distribution of $H_2O$ in the soot preform is important for OH concentration homogeneity in the consolidated glass.

Thus, it has been found desirable to maintain a temperature elevation rate of less than 0.4° C./minute between 1150-

1450° C. during sintering. More preferably, during 1000-1600° C., if the preform is brought to such high temperature up to 1600° C., the temperature elevation rate during sintering is maintained at less than 0.4° C./minute. Preferably, between 1150-1450° C., the temperature elevation rate is maintained at less than 0.2° C./minute. Even more desirably, in order to obtain a high compositional homogeneity in the consolidated glass, the preform is first isothermally held at a temperature between 1150 to 1300° C. for at least one hour prior to final densification. Preferably, the preform is isothermally held at a temperature between 1150 and 1300° C. for more than 5 hours, but less than 200 hours.

It has also been found by the present inventors that, in order to obtain consolidated glass having a high transmission at 193 nm, it is important that the consolidation is carried out in a furnace environment essentially inert to the consolidation atmosphere. In the present application, by the term "inert to the treatment or consolidation atmosphere," it is meant that the material meets at least one of the following conditions: (a) the material essentially does not react with the treatment or consolidation atmosphere under the treatment or consolidation conditions; (b) if the material reacts with the treatment or consolidation atmosphere, the reaction essentially does not generate substantial amount of gas, such as CO or $CO_2$, which negatively affects the transmission at 193 nm of the consolidated glass; (c) if the material reacts with the treatment or consolidation atmosphere, the reaction is limited to the surface area exposed to the atmosphere, and the reaction product forms a coating that effectively protects the bulk of the material from further reacting with the atmosphere under the treatment or consolidation conditions. Therefore, because the consolidation atmosphere in the process of the present invention comprises $H_2O$ and/or $O_2$, it is important that the consolidation furnace muffle has an inner surface exposed to the consolidation atmosphere inert to $H_2O$ and/or $O_2$ under consolidation conditions. Non-limiting examples of such materials for the inner surface include refractories such as fused silica, $Al_2O_3$, $ZrO_2$, zircon ($ZrO_2.SiO_2$), precious metals such as Pt, Re, and the like, SiN and SiC. SiC reacts with $H_2O$ or $O_2$ at the consolidation temperature to produce a thin layer of $SiO_2$, which prevents further reaction into the bulk of the material. The amount of CO and/or $CO_2$ generated in the reaction is too small to negatively affect the property of the consolidated glass. However, graphite, albeit conventionally a very good refractory material, has been found not to be the ideal material for the inner surface of the muffle. This is presumably because of the following reactions under consolidation conditions:

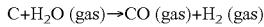

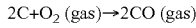

Therefore, $H_2O$ and $O_2$ are depleted by the graphite. In addition, because consolidation in the presence of CO and $H_2$ leads to the formation of oxygen-deficient centers in the glass, they are detrimental to the transmission at 193 nm of the consolidated glass. Moreover, due to limited solubility in silica, CO and $CO_2$ can cause compositional in-homogeneity in the consolidated glass.

After the consolidation step (iv), the consolidated glass may be optionally cut, then rolled or sagged into planer or other desired shape.

Figure 2:
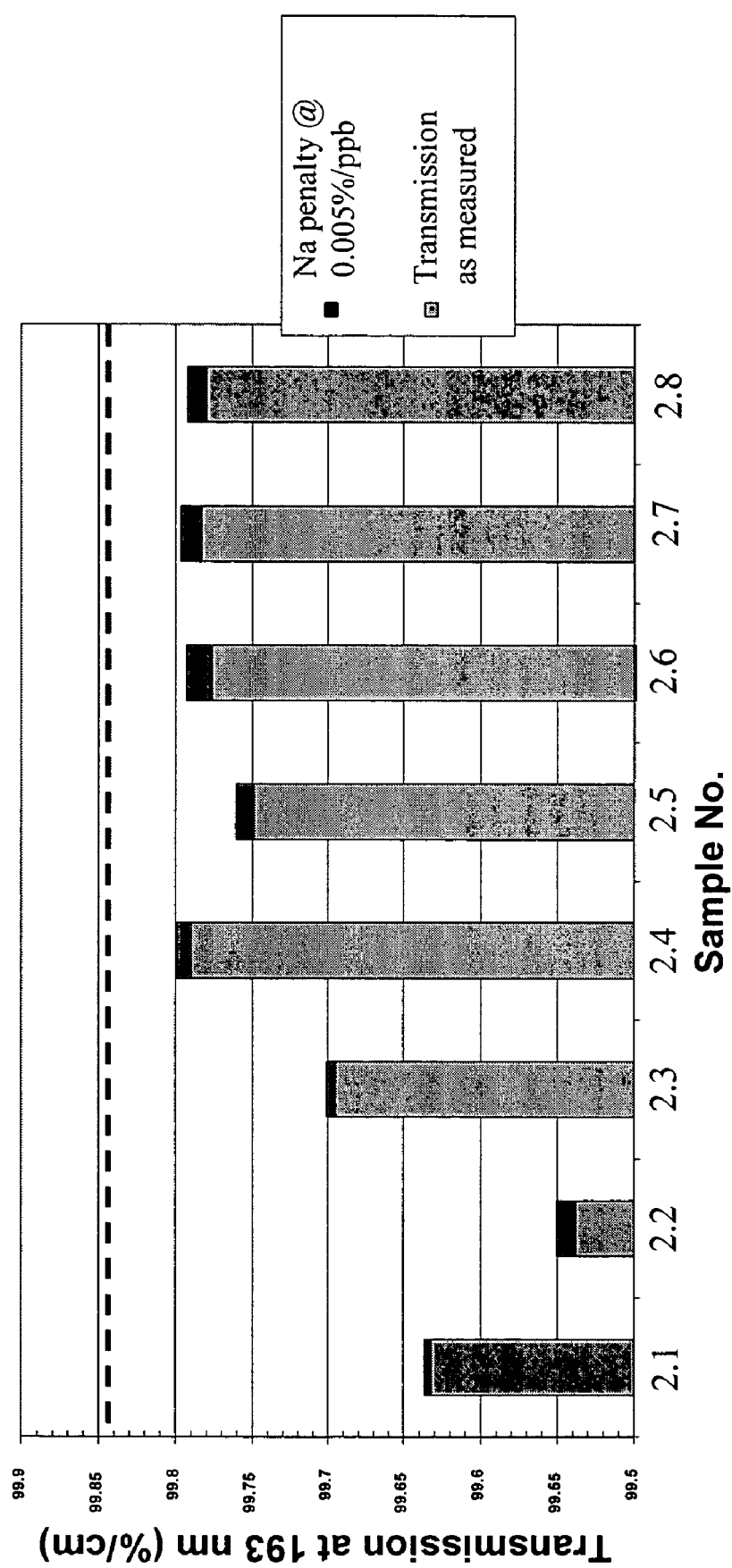
FIG. 2 is a diagram showing the internal transmission at 193 nm of a series of synthetic silica glass samples.

The present inventors have prepared a series of synthetic silica glass materials by using the soot-to-glass method under different consolidation atmospheres. The soot particles were generated from an $OMCTS/O_2$ flame. The soot particles were collected axially on the outer surface of a rotating core rod. After such deposition, the soot preforms, having an initial soot density of about 0.4-0.5 $g/cm^3$, were then consolidated under various consolidation conditions in the presence of a series of different consolidation atmosphere. The consolidated silica glasses were then measured for internal transmission at 193 nm. The results of a series of such samples (Sample Nos. 2.1, 2.2, 2.3, 2.4, 2.5, 2.6, 2.7 and 2.8) are illustrated in FIG. 2. Shown in this figure include both the transmission as measured at 193 nm and transmission penalty (transmission loss) due to the presence of Na. These samples have the OH and Cl concentrations in ppm by weight listed in the following TABLE I:

TABLE I

| | Sample No. | | | | | | | |
|---|---|---|---|---|---|---|---|---|
| | 2.1 | 2.2 | 2.3 | 2.4 | 2.5 | 2.6 | 2.7 | 2.8 |
| OH | 9 | 55 | 6 | 155 | 362 | 570 | 872 | 1284 |
| Cl | 222 | 29 | 123 | 16 | 17 | 17 | 12 | 18 |

Several of the samples showed excellent transmission (>99.75%/cm) at 193 nm, while other samples had lower transmission. The Rayleigh limit at 193 nm for transmission is ~99.85%/cm for these types of glasses, which is also shown in FIG. 2 as a dotted line.

Figure 3:
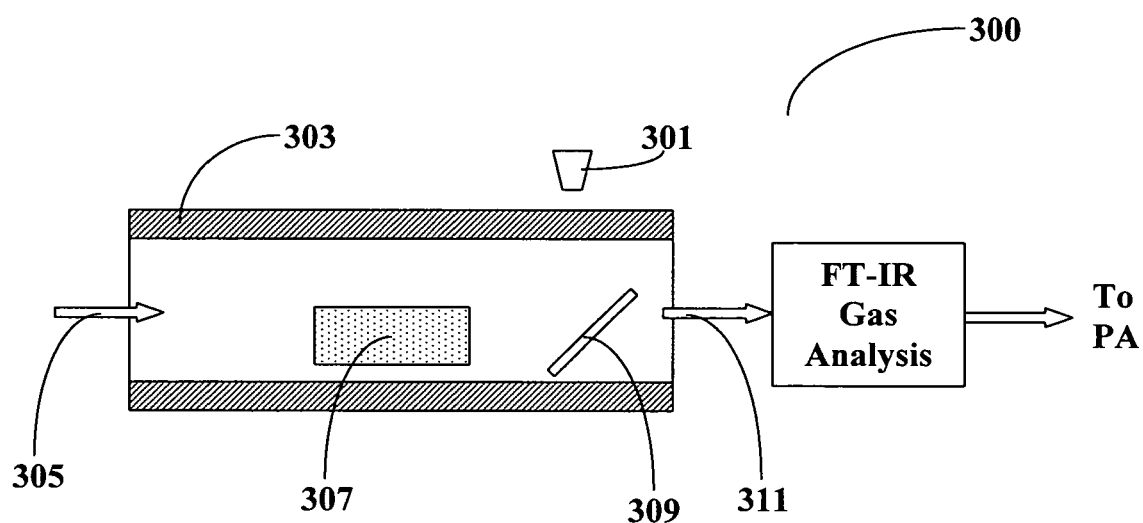
FIG. 3 is schematic illustration of the experimental set-up of the equipment for treating and consolidating silica soot preforms.

FIG. 3 is a schematic illustration of the experimental set-up used to treat and consolidate a soot preform and synthetic silica in various atmospheres. Treatment of the soot preform and synthetic silica includes, but is not limited to, purification, chlorine stripping, and the like, to be discussed below. In this experimental set-up 300, 303 is a furnace muffle constructed of silica, which meets the furnace requirements of being inert to the treatment or consolidation atmosphere. The arrow 305 signifies that the atmosphere, including, for example, He, $O_2$, $H_2O$, CO, $CO_2$, and the like, was introduced into the furnace muffle in this direction. The soot preform 307 is placed in the furnace muffle and treated and/or sinter under the consolidation conditions. A mirror 309 placed inside the muffle 303 reflects light emitted and/or reflected by the preform during the treatment and/or consolidation, and the reflected light is detected by a camera 301 placed outside of the muffle, making it possible to record and/or observe the treatment and/or consolidation process taking place inside the furnace muffle. Exit gas 311 is further analyzed by FT-IR for composition information, and thereafter allowed to enter the pollution abatement system.

Figure 4:
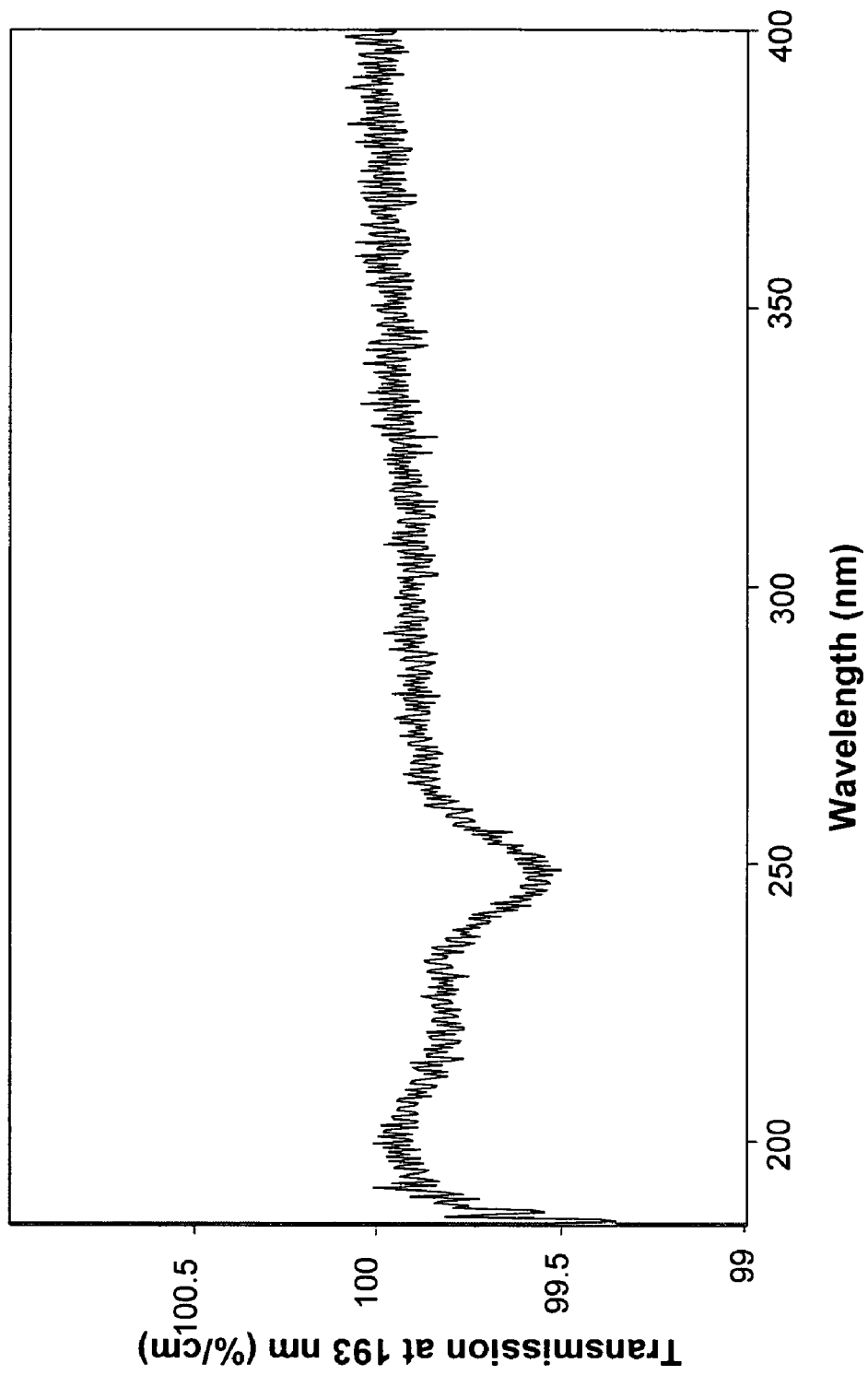
FIG. 4 is a diagram showing the UV transmission spectral curve of a silica glass prepared by consolidating a $Cl_2$ dried soot preform in a helium only atmosphere.

FIG. 4 shows a UV spectral curve of a chlorine dried $SiO_2$ soot preform which was then consolidated in a helium-only atmosphere. Sample is referenced against Corning 7980 glass. The resulting glass shows a broad absorption peak centered at 248 nm and other broad absorption at ~220 nm and below 200 nm. It is believed that this is a result of oxygen-deficient silica formation originating from the chlorine drying process.

Figure 5:
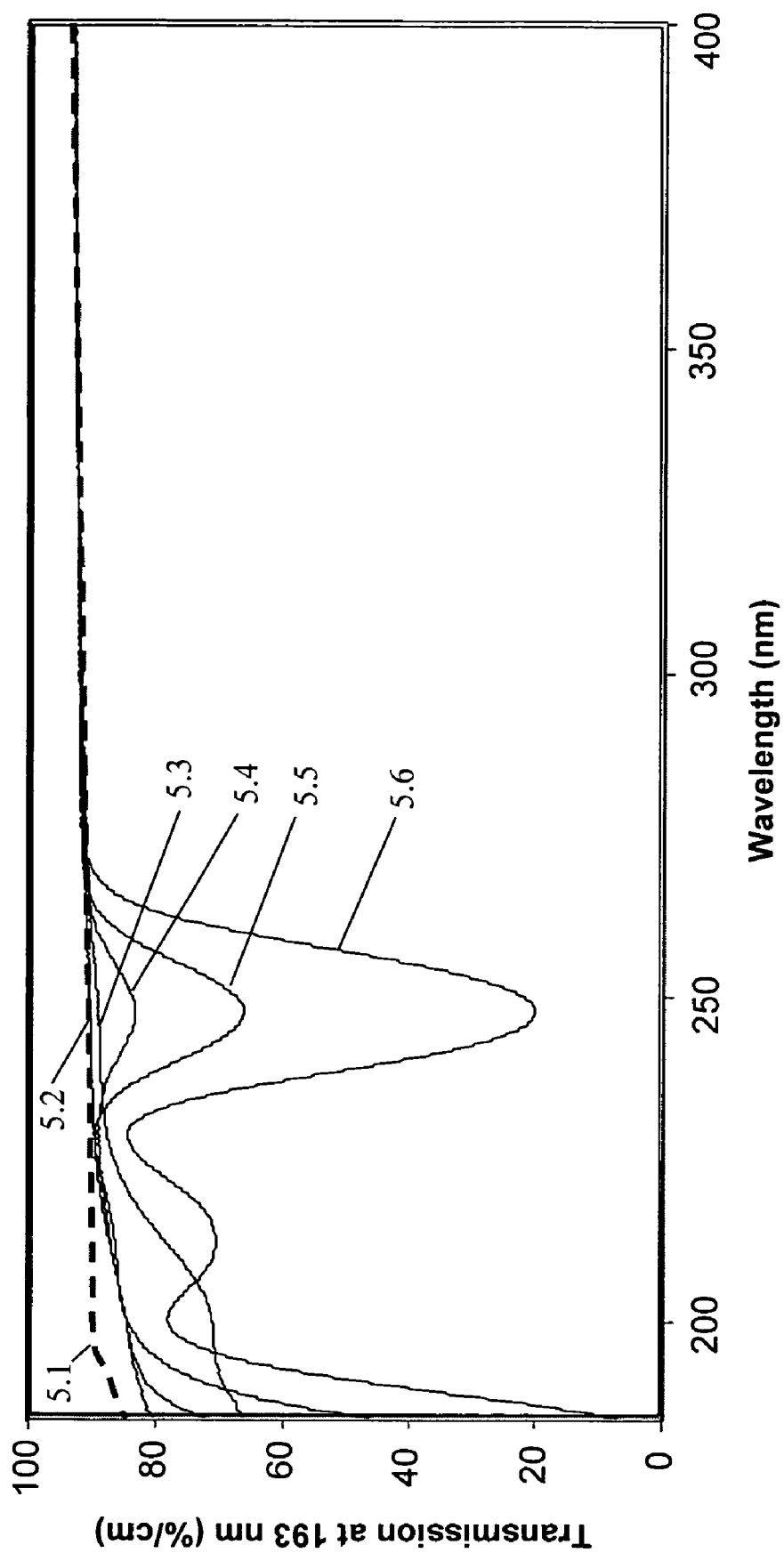
FIG. 5 is a diagram showing the UV transmission spectral curves of silica glass samples prepared by consolidating $Cl_2$ dried soot preforms in different consolidation atmospheres.

FIG. 5 shows UV spectral curves for several different glass samples (Sample Nos. 5.1, 5.2, 5.3, 5.4, 5.5 and 5.6) of $Cl_2$ dried $SiO_2$ soot preforms which were then consolidated in different atmospheres indicated in TABLE II as follows:

TABLE II

| | Sample No. | | | | | |
|---|---|---|---|---|---|---|
| | 5.1 | 5.2 | 5.3 | 5.4 | 5.5 | 5.6 |
| Consolidation atmosphere | $H_2$ + $H_2O$ + He | $CO_2$ + He | He only | 1% CO in He | 1% $H_2$ in He | 1% $H_2$ + 1% CO in He |

Percentages in this table are by volume.

Samples are referenced to a nitrogen atmosphere. From this figure, it is clear that when the samples were consolidated in atmosphere containing dry He plus $H_2$ and/or CO and/or $CO_2$, the resulting glasses showed a broad absorption peak centered at 248 nm and other broad absorptions at ~220 nm and below 200 nm. It is believed that this is a result of oxygen-deficient silica formation originating from the chlorine drying process as well as defects caused by reaction of $H_2$, CO or $CO_2$ reacting with the silica. However, when $H_2O$ is added to the consolidation atmosphere, even atmospheres that contain $H_2$ or CO reducing agents, the UV transmission is seen to substantially improve. It is believed that this is a result of oxidizing and healing the silica defects (or never allowing them to form in the first place).

Chlorine is often used in the manufacturing of high purity, high transmitting glasses. However, residual chlorine has been found to adversely impact the glass for use at 193 nm wavelengths in three ways. First, it has been found to reduce initial transmission. Second, it has been found to change the index of refraction in the glass and thus cause inhomogeneity at both low and high (striae) spatial frequencies. Third, chlorine is expected to contribute to laser induced damage, both induced absorption and laser induced wavefront distortion (LIWFD). The present invention identifies and quantifies the impact of chlorine on these properties, identifies the upper limits for chlorine which are acceptable to a quality glass, and offers means for minimizing/eliminating chlorine in the glass.

Figure 6:
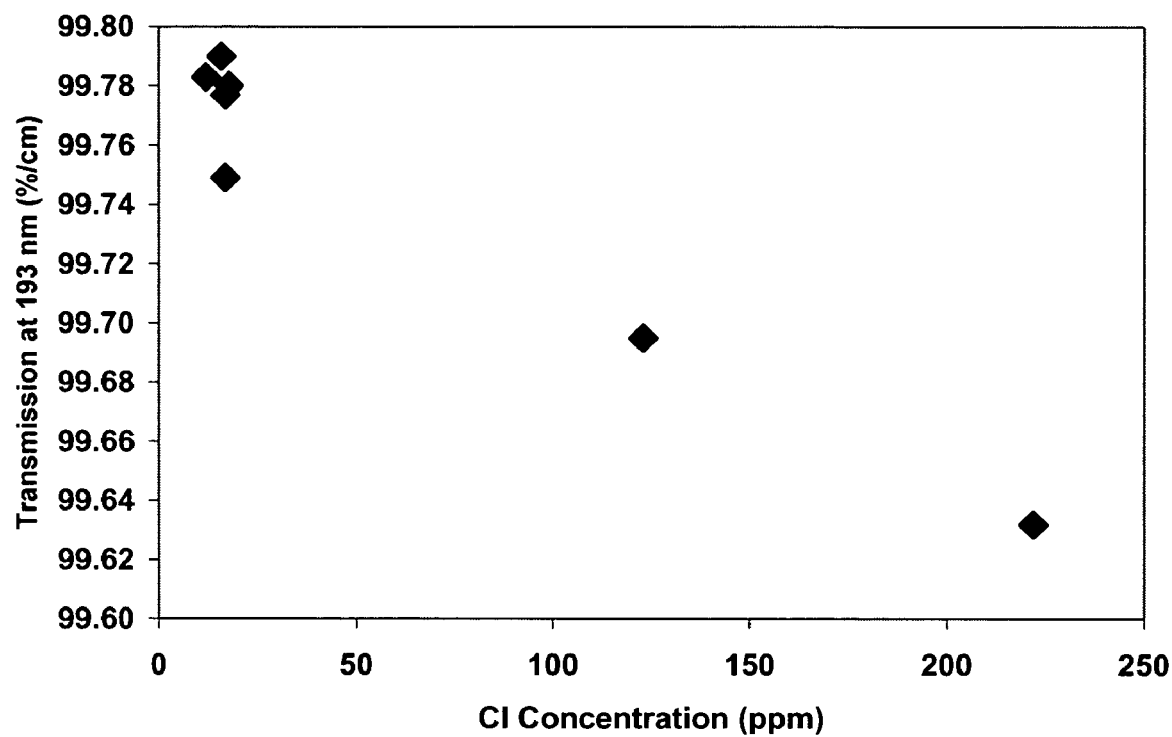
FIG. 6 is a diagram showing the dependency of the transmission of silica glass at 193 nm on the chlorine concentration in the glass.

Transmission at 193 nm wavelengths was measured on glass made with different levels of chlorine in order to determine the impact of chlorine on transmission. Other metal impurities within the glass were held constant at levels below a few ppb. The results are summarized in FIG. 6 which suggests a transmission loss of 0.00073%/cm per ppm of chlorine.

Internal transmission losses for 193 nm wavelengths are typically less than 0.30%/cm, preferably less than 0.30%/cm, more preferably less than 0.25%/cm, most preferably less than 0.20%/cm. It is estimated that theoretical absorption (Rayleigh limit) within a 100% pure material is 0.15%/cm loss inherent within fused silica. This implies that only 0.1%/cm internal absorption from all sources other than the 0.15%/cm which is inherent within the glass is acceptable. Based on this information, the targeted Cl level should be well below 140 ppm and preferably much less than 50 ppm in order to keep the transmission loss at less than 0.1%/cm, or preferably less than 0.04%/cm.

Chlorine and/or chlorine-containing compounds are often used in the production of soot pre-forms (laydown step) and/or during treatment of soot preforms (consolidation step). In the laydown step, the precursor can be a chlorine-containing compound, such as $SiCl_4$. In the consolidation step, chlorine or chlorine-containing compounds are often used to reduce the β-OH (drying) and/or metal impurities (purification) which may be present in the soot. Means of minimizing or eliminating the presence of chlorine in these two steps are described as follows.

First consider the laydown step. $SiCl_4$ and other chlorine-containing precursors can be replaced with chlorine-free precursors for the production of Cl-free soot preforms in the laydown step. OMCTS and other organic precursors have been used to make large Cl-free soot performs (over 20 kg, for example). If a Cl-containing precursor (e.g., $SiCl_4$) is used, the Cl content of the soot preform is minimized by the use of H-containing fuels (e.g., $H_2$, $CH_4$, etc.) since hydrogen is an effective chlorine getter (water or hydrogen react with chlorine to form HCl which is swept away with the exhaust gases).

Figure 7:
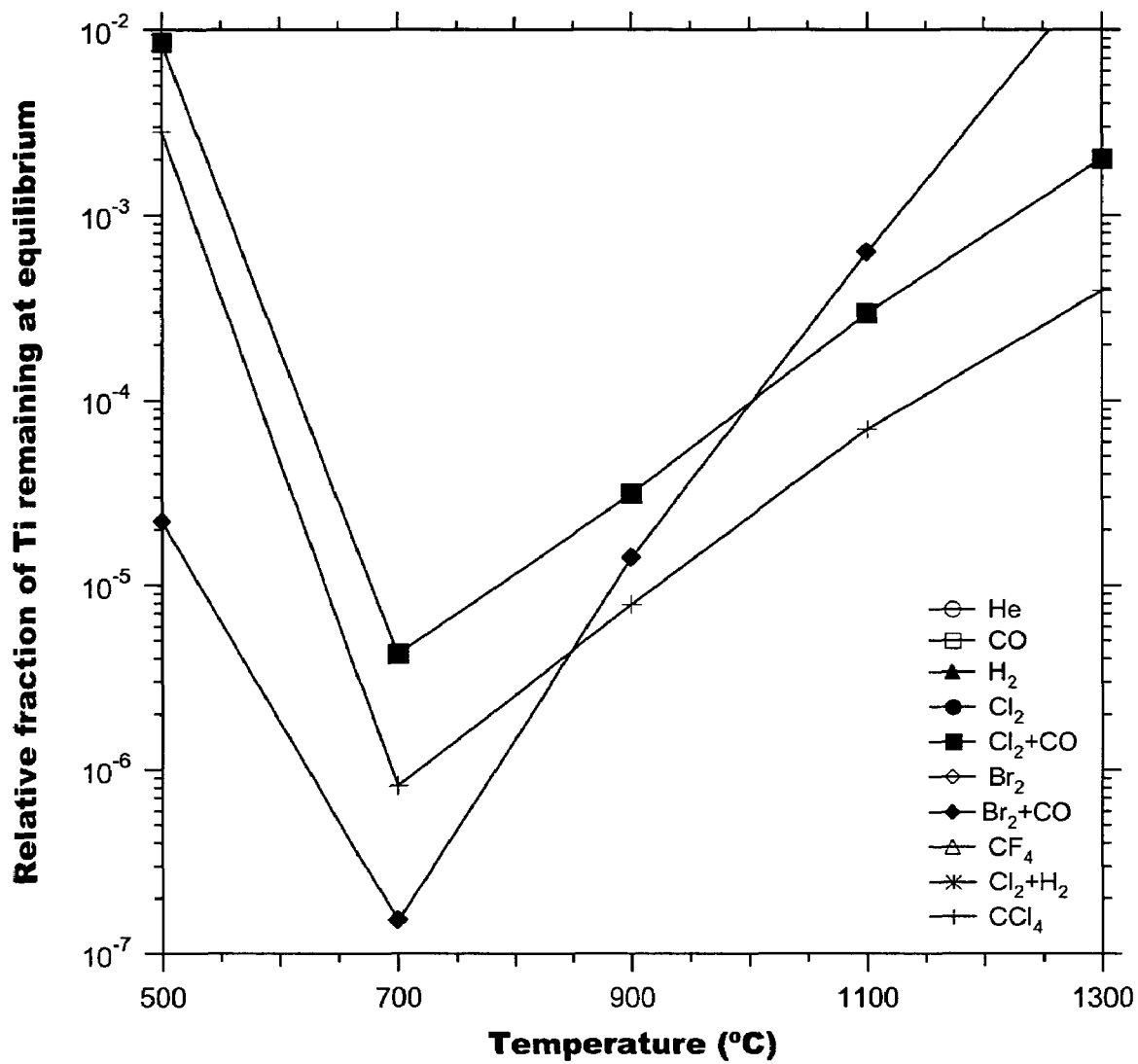
FIG. 7 is a diagram showing relative fraction of Ti remaining in the soot at equilibrium as a function of treatment temperature when treated by various stripping agents.
Figure 8:
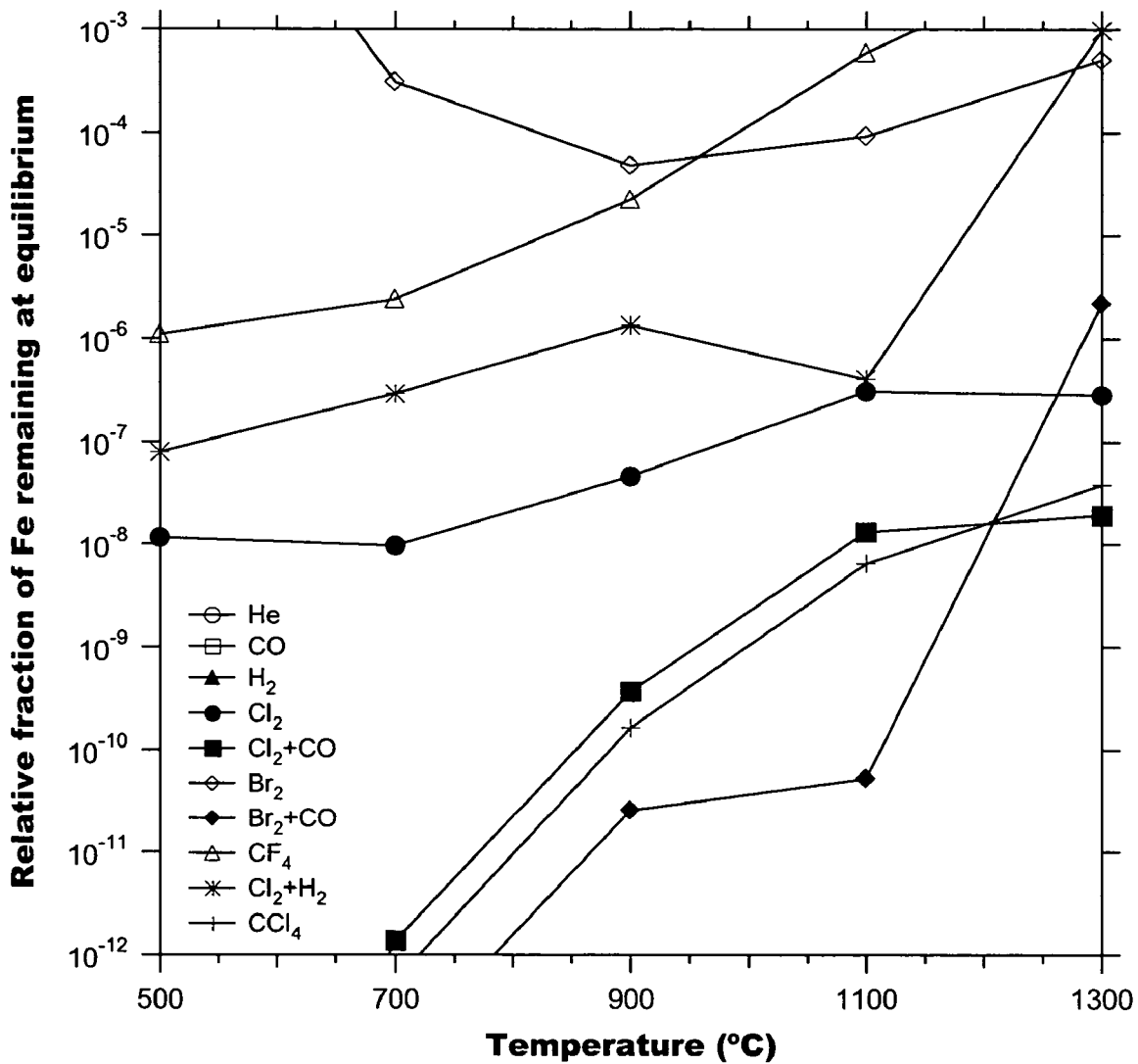
FIG. 8 is a diagram showing relative fraction of Fe remaining in the soot at equilibrium as a function of treatment temperature when treated by various stripping agents.
Figure 9:
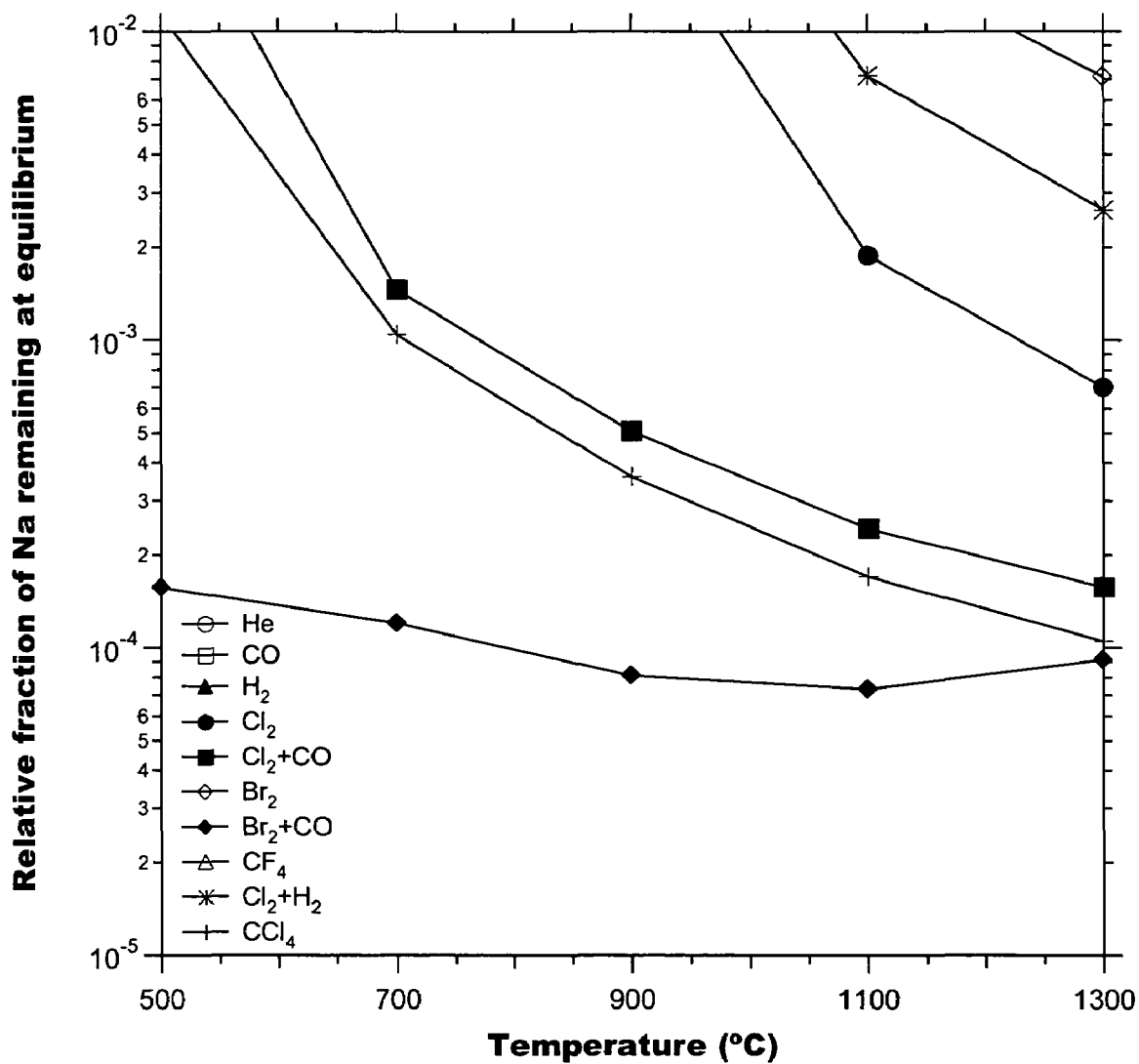
FIG. 9 is a diagram showing relative fraction of Na remaining in the soot at equilibrium as a function of treatment temperature when treated by various stripping agents.
Figure 10:
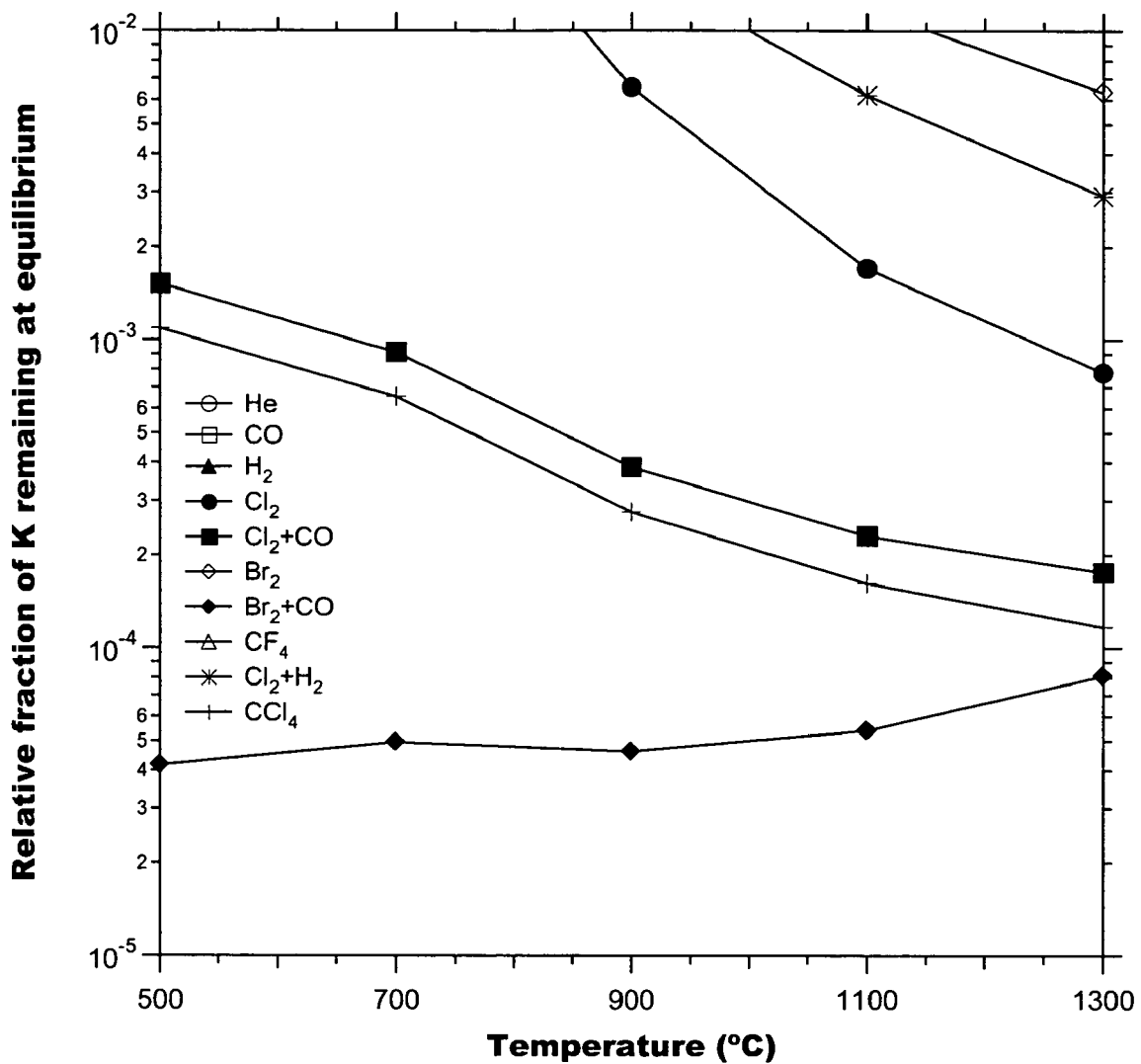
FIG. 10 is a diagram showing relative fraction of K remaining in the soot at equilibrium as a function of treatment temperature when treated by various stripping agents.

Next consider the consolidation step. Chlorine and chlorine-containing compounds are commonly used to dry and purify soot preforms at a temperature of ~1000° C. prior to sintering. Thermochemical modeling was used to evaluate the relative strengths of eight candidate agents ($Cl_2$, $Br_2$, $H_2$, CO, $CF_4$, $Cl_2$+CO, $Br_2$+CO, and $Cl_2$+$H_2$ (i.e., HCl)) to strip the four most important tramp metals (Ti, Fe, Na and K). The results are shown in FIGS. 7-10. The vertical axes in these figures are relative fraction of metal remaining in the glass at equilibrium—the lower the fraction, the better the stripping agent. FIG. 7 is a diagram showing the fraction of Ti remaining in the soot after equilibrium with a stripping agent. In this figure, the curves for He, CO, $H_2$, $Cl_2$, $Br_2$, $CF_4$ and $Cl_2$+$H_2$ lie above $10^{-2}$ and do not appear in the plot. FIG. 8 is a plot showing the fraction of Fe remaining in the soot after equilibration with a stripping agent. In this figure, the curves for He, CO, and $H_2$ lie above $10^{-3}$ and are not shown in the plot. FIG. 9 is a diagram showing the fraction of Na remaining in the soot after equilibration with a stripping agent. In this figure, the He, CO, $H_2$, and $CF_4$ curves lie above $10^{-2}$ and do not appear in the plot. FIG. 10 is a diagram showing the fraction of K remaining in the soot after equilibration with a stripping agent. In this figure, the He, CO, $H_2$, and $CF_4$ curves lie above $10^{-2}$ and do not appear in the plot. The results suggest the following trend in terms of efficacy of the stripping agents for the metal impurities: CO~$H_2$~$CF_4$<$Br_2$~$Cl_2$+$H_2$ (i.e., HCl) <$Cl_2$<$Cl_2$+CO<$Br_2$+CO.

Figure 11:
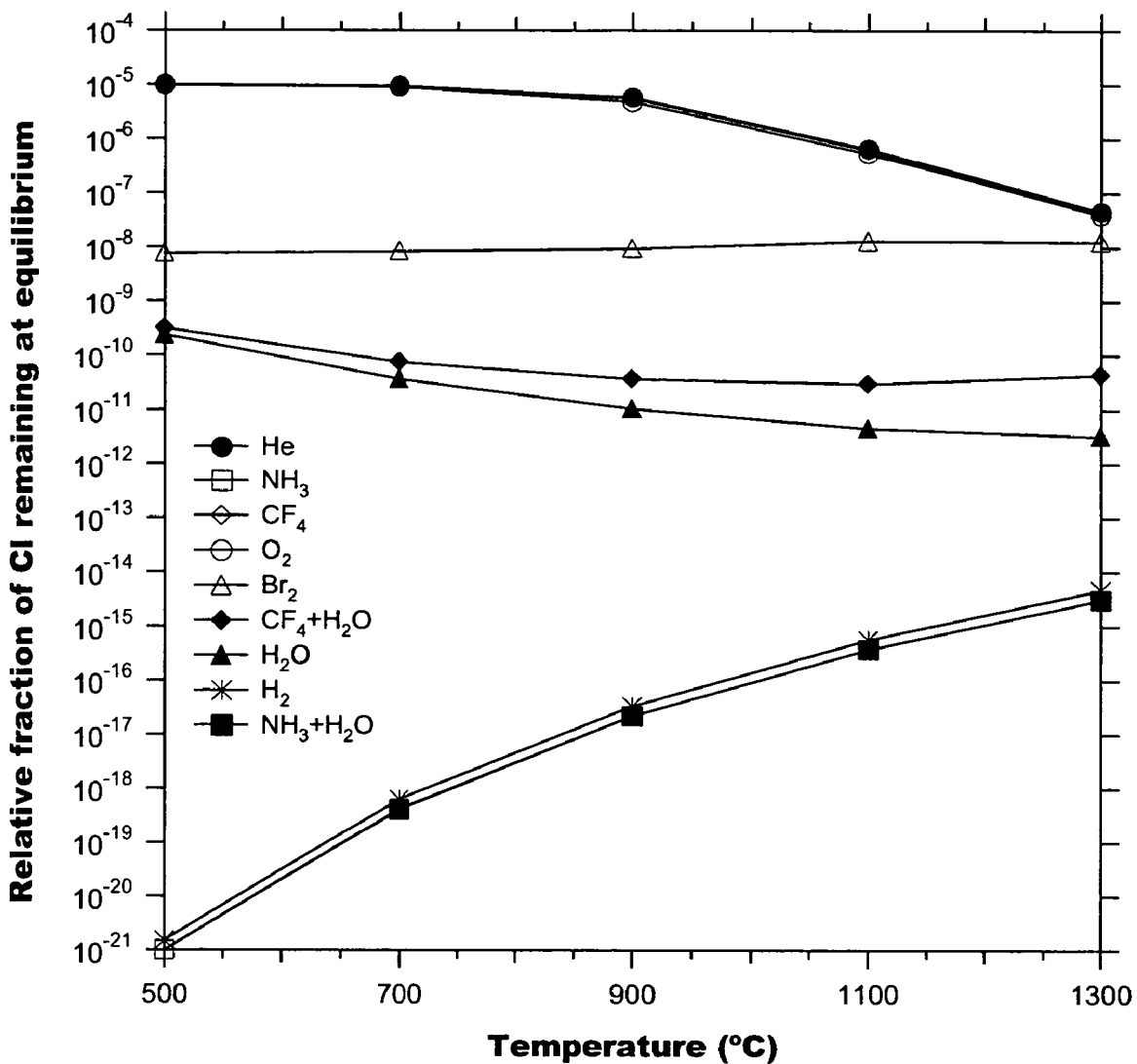
FIG. 11 is a diagram showing relative fraction of chlorine remaining in the soot at equilibrium as a function of treatment temperature when treated by various chlorine stripping agents.

If chlorine and its compounds are kept out of both the laydown and the consolidation steps (e.g., by the use of Cl-free precursors in laydown and Cl-free purification agents (e.g., $Br_2$, HBr, $Br_2$+CO) in the consolidation), the fused silica glass produced from such soot preforms will be free of chlorine. However, if these steps cannot be kept strictly chlorine-free, then a chlorine stripping step must be added before the consolidation in order to produce Cl-free glass. Thermochemical modeling was used to evaluate the relative chlorine-stripping strengths of eight candidate agents ($H_2O$, $H_2$, $CF_4$, $Br_2$, $O_2$, $NH_3$, $NH_3$+$H_2O$ and $CF_4$+$H_2O$). The results are shown in FIG. 11. The vertical axis in this figure is the partial pressure of $Cl_2$ ($P_{Cl_2}$) in the gas phase in equilibrium—the lower the $P_{Cl_2}$, the better the stripping agent. The results suggest the following trend: $NH_3$~$NH_3$+$H_2O$~$H_2$>$H_2O$~$CF_4$+$H_2O$>$Br_2$>$O_2$>$CF_4$. The limitations of the model must be kept in mind—most important is the inability to model the reactions on the soot itself. This limitation is probably responsible for the discrepancy between model predictions and experimental results for $H_2$ versus $H_2O$. While the model predicts that $H_2$ will be a better chlorine stripper than $H_2O$, the experimental results show the opposite. This appears to be due to the reactions on the soot —Si—O—H bonds are more stable/preferred compared to Si—H bonds, i.e., for equivalent partial pressure of $H_2$ and $H_2O$, reaction (2) below is driven much further to the right than reaction (1):

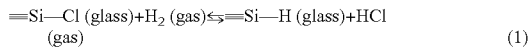

(1)

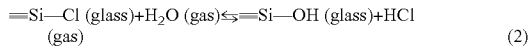

(2)

We have discovered that $SiO_2$ soot deposited using ultra pure (with sub-ppb impurity) silica precursors such as OMCTS (or $SiCl_4$), then kept clean, and consolidated in a clean atmosphere/furnace has produced very high transmission glasses (at least 99.82% at 193 nm) without the need for purification of the glass by chlorine or any other purification agent (the data is shown below). This process is a more cost-effective manufacturing process and avoids possible transmission optical defects caused by chlorine purification of the soot.

We have also done measurements and analysis to understand the impact of $O_2$ in sinter on the transmission of several soot-to-glass silica samples. Slices from three blanks (Blank Nos. 1, 2 and 3) below were used for VUV transmission and Raman $O_2$ measurements. For Blank No. 1, $O_2$ was present only in the preheat atmosphere, but not present in the consolidation atmosphere. For Blank No. 2, 3% $O_2$ was present in the consolidation (sintering) atmosphere. For Blank No. 3, 33% $O_2$ was present in the consolidation (sintering) atmosphere.

All three blanks contain about 100 ppm by weight OH.

Figure 12:
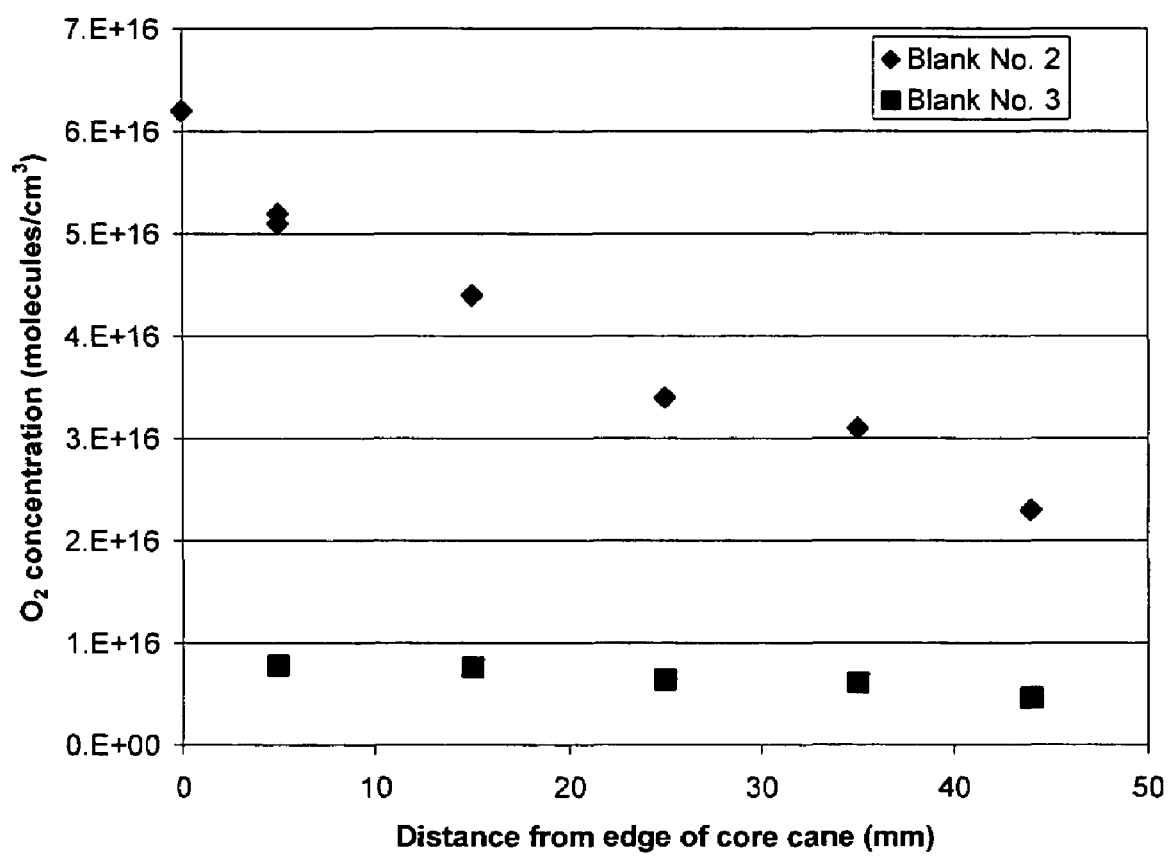
FIG. 12 is a diagram showing the radial $O_2$ concentration profile in two silica glass samples prepared using the soot-to-glass method.
Figure 13:
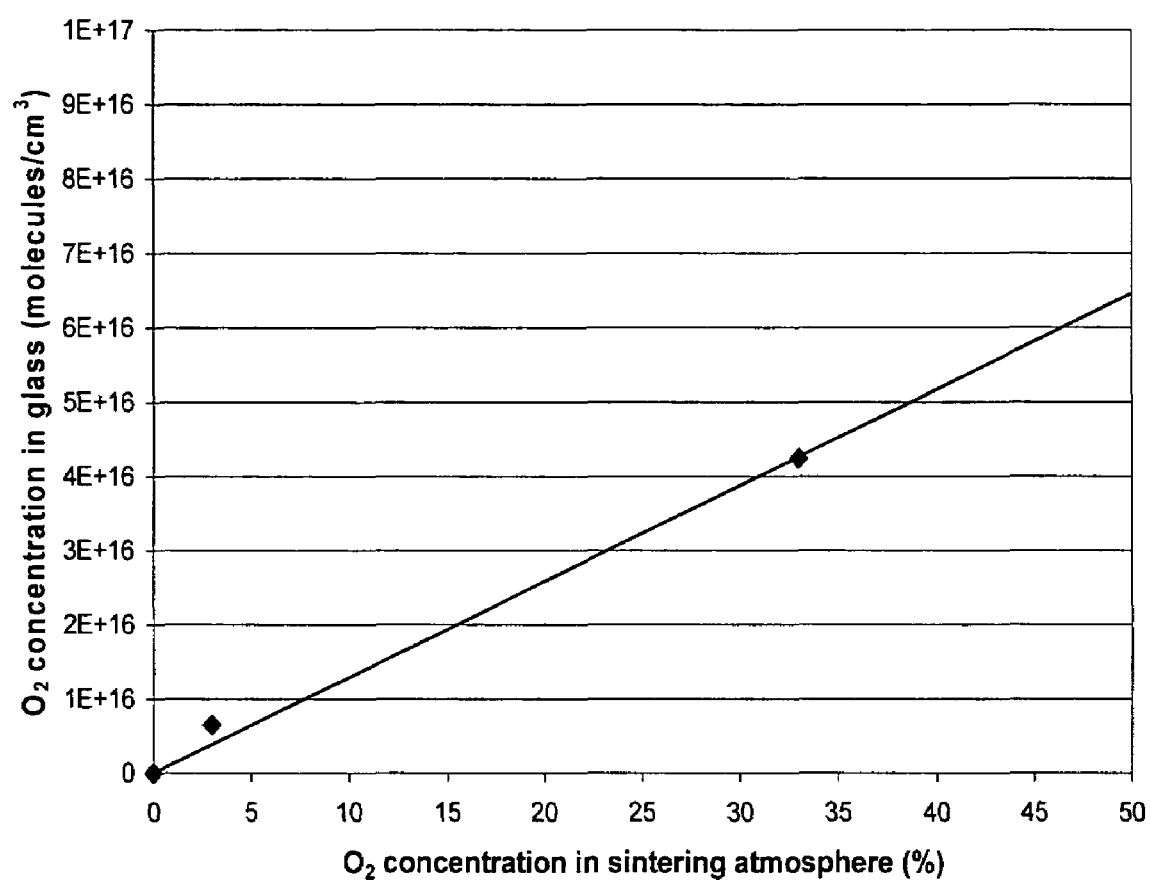
FIG. 13 is a diagram showing the correlation between $O_2$ concentration in the consolidated glass and $O_2$ concentration in the consolidating atmosphere.

Radial samples were cut from the slices of Blank Nos. 2 and 3. Samples were measured for $O_2$ using the FT-Raman Spectrometer. The radial $O_2$ concentration profiles in the two blanks are plotted in FIG. 12. Also plotted, in FIG. 13, are average $O_2$ in the glass (calculated from the Raman data) versus percentage of $O_2$ in the sintering atmosphere to provide an understanding of how much molecular $O_2$ one can expect to get in the glass at different $O_2$ levels during sintering.

Figure 14:
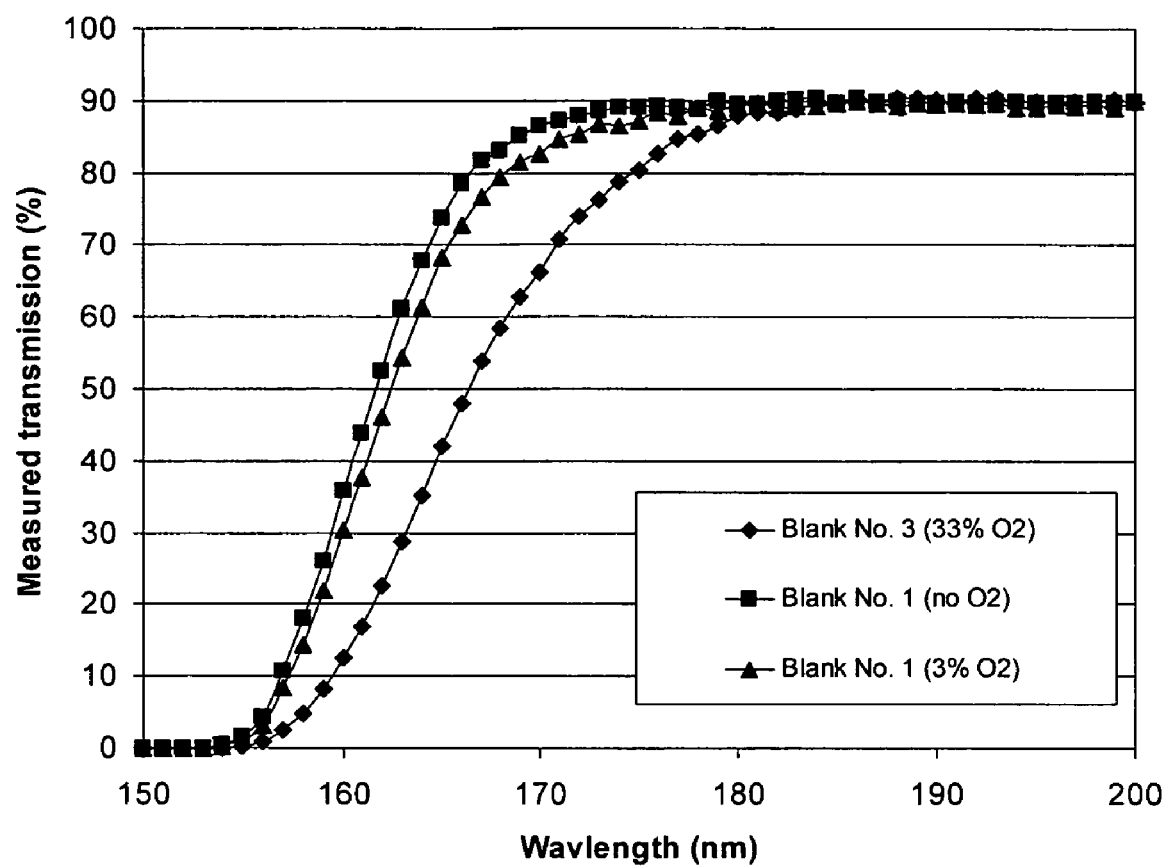
FIG. 14 is a diagram showing the measured transmission of three silica glass samples.
Figure 15:
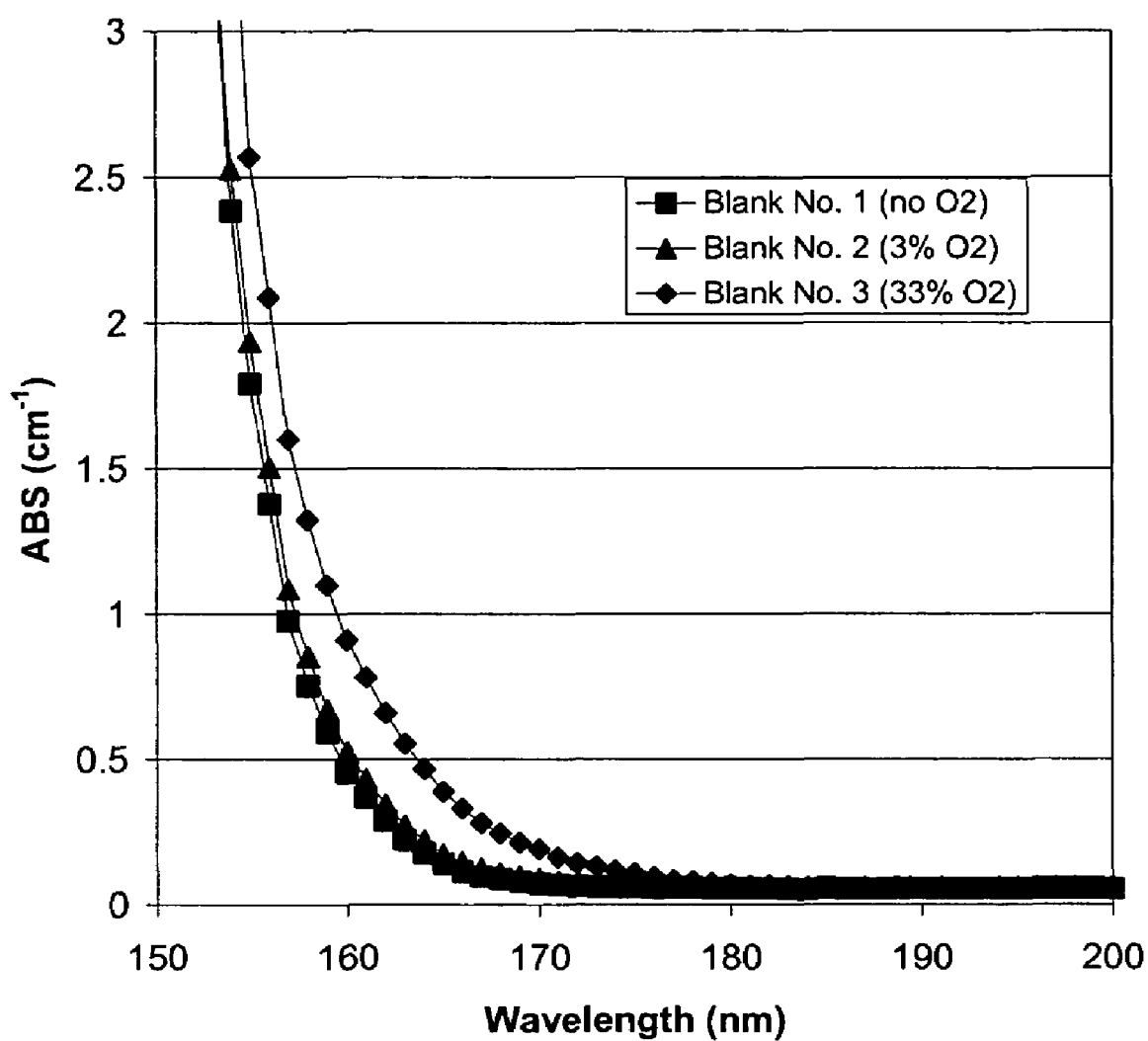
FIG. 15 is a diagram showing the absorptivity between 150 and 200 nm of the three silica samples of FIG. 14.

Samples, 10 mm thick, were cut from the 40 mm radial position of the Blank Nos. 1, 2 and 3 slices. VUV transmission spectra were measured using a McPherson Vacuum Spectrometer. The transmission curves are shown in FIG. 14. Absorption curves for Blank Nos. 1, 2 and 3 are provided in FIG. 15. A broad absorption due to excess $O_2$ is visible below about 180 nm.

The absorption cross-section ($\sigma$) of a species is defined by the following equation:

$$\sigma = ABS/N$$

where ABS is the absorption in $cm^{-1}$, N is the concentration in molecules/$cm^3$, and $\sigma$ is in unit of $cm^2$. The absorption cross-section was calculated for $O_2$ in silica as a function of wavelength in the following manner.

Figure 16:
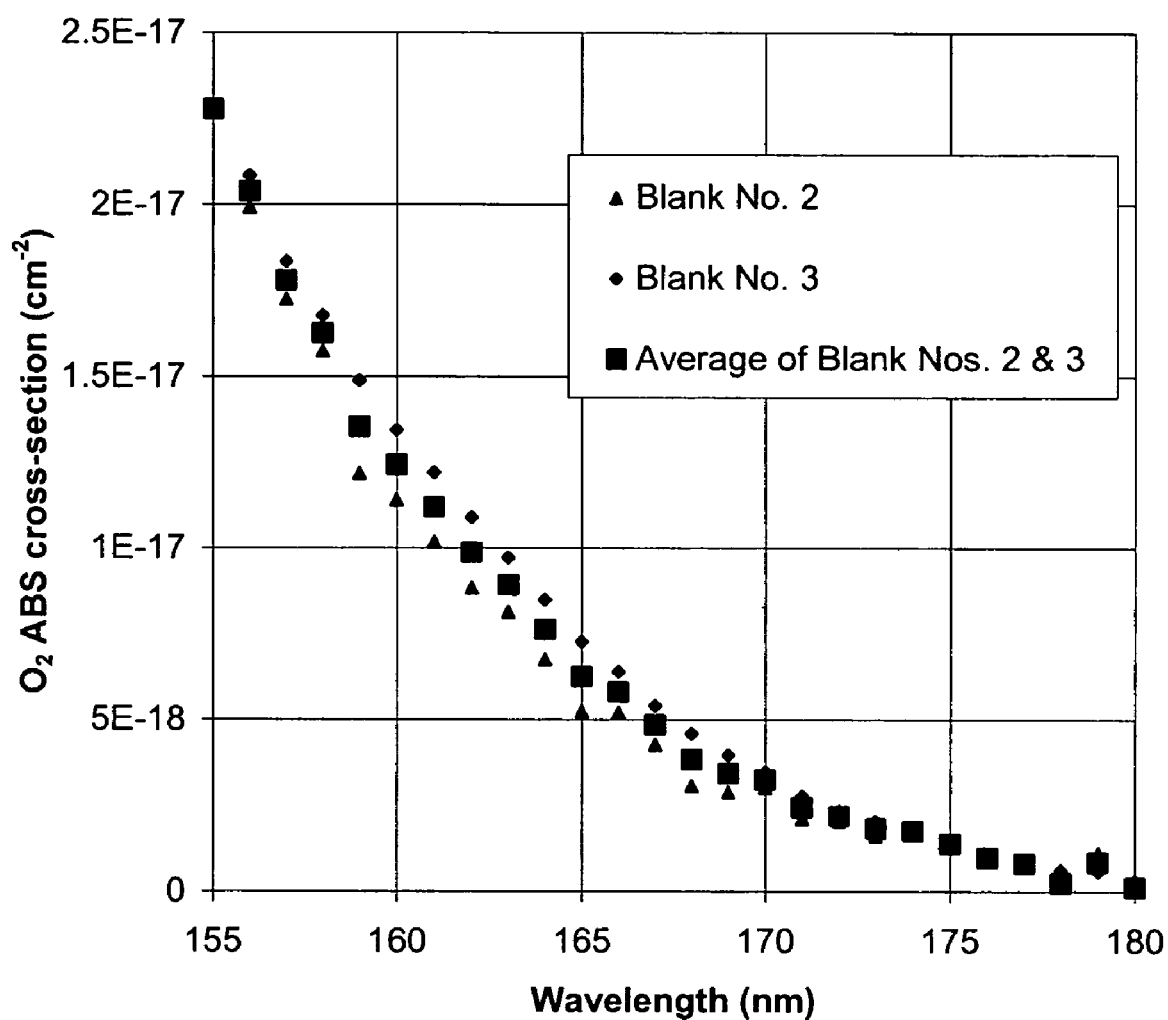
FIG. 16 is a diagram showing the $O_2$ absorption cross-section vs. wavelength of two silica glass samples.

The absorption spectrum data of Blank No. 1 were subtracted from Blank Nos. 2 and 3 spectra data to determine the excess absorption due to $O_2$ in Blank Nos. 2 and 3. Then these data were divided by the level of $O_2$ in the glass: $6.4 \times 10^{15}$ molecules/$cm^3$ and $3.4 \times 10^{16}$ molecules/$cm^3$ for Blank Nos. 2 and 3, respectively. The plot in FIG. 16 shows the calculated $O_2$ absorption cross-section as a function of wavelength from 155-175 nm. The squares in FIG. 16 are the average of the values calculated from the two glasses. The difference in the cross-sections calculated from the two glasses may be due to small differences in the level of OH or other absorbing defects.

Figure 17:
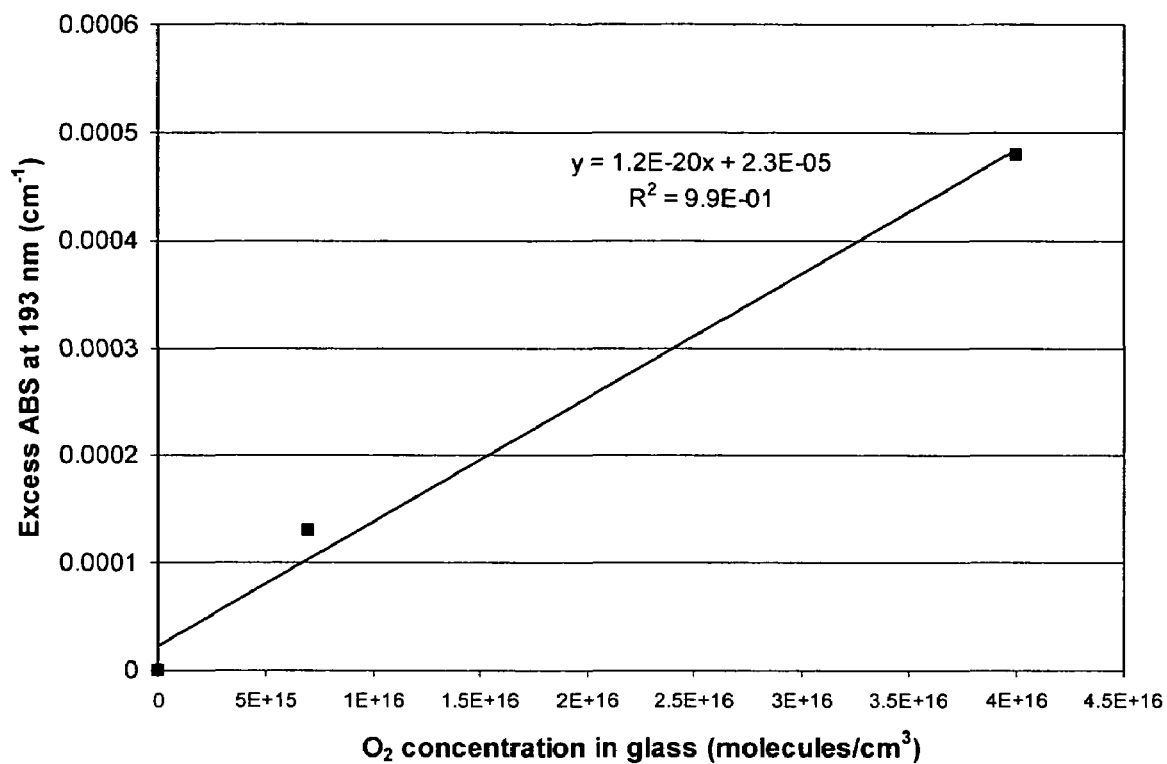
FIG. 17 is a diagram showing how the $O_2$ absorption cross-section at 193 nm of the silica glass of the samples illustrated in FIG. 16 is derived.

The absorption in these samples at 193 nm was too low to allow direct calculation of an absorption cross-section at this wavelength. Instead, the 193 nm transmission was measured on 37.5 mm pathlength samples. Internal 193 nm transmission data for the three blanks is shown in TABLE III. Excess absorption at 193 nm was calculated by converting the transmission data to absorption and subtracting the absorption of Blank No. 1. Plotting excess ABS versus $O_2$ concentration in FIG. 17, and taking the slope of the straight lines through the data points, yields a 193 nm absorption cross section for $O_2$ in silica of $1.2 \times 10^{-20}$ $cm^2$. This value translates to a transmission penalty at 193 nm of about $6 \times 10^{-5}$%/cm per ppb by mole of $O_2$.

TABLE III

| Blank No. | Transmission (%/cm) | Excess ABS at 193 nm ($cm^{-1}$) | $O_2$ concentration (molecules/$cm^3$) |
|---|---|---|---|
| 1 | 99.82 | 0 | 0 |
| 2 | 99.78 | 0.00013 | $6.98 \times 10^{15}$ |
| 3 | 99.70 | 0.00048 | $4.00 \times 10^{16}$ |

TABLE IV summarizes the calculated $O_2$ absorption cross-section values. Also included in this table are $O_2$ absorption cross-sections previously calculated from dry F-doped silica glasses that were sintered in oxygen and values for gaseous oxygen available in the prior art. The cross-sections calculated from the soot-to-glass silica glasses are consistent with this work.

TABLE IV

| Wavelength (nm) | $O_2$ ABS cross-section ($cm^2$) ($\times 10^{-18}$) | | |
|---|---|---|---|
| | Glass of the present invention | Dry F-silica glass | Gaseous $O_2$ |
| 155 | 22.8 | | 3.6 |
| 156 | 20.4 | | |
| 157 | 17.8 | 14.1 | 2.9 |
| 158 | 16.3 | | |
| 159 | 13.5 | | |
| 160 | 12.4 | | |
| 161 | 11.2 | | |
| 162 | 9.88 | | |
| 163 | 8.94 | 8.24 | 1.3 |
| 164 | 7.64 | | |
| 165 | 6.26 | | |
| 166 | 5.81 | | |
| 167 | 4.85 | | |
| 168 | 3.84 | | |
| 169 | 3.43 | | |
| 170 | 3.25 | | |
| 171 | 2.45 | | |
| 172 | 2.19 | | |
| 173 | 1.83 | | |
| 174 | 1.75 | | |
| 175 | 1.39 | | |
| 193 | $1.20 \times 10^{-2}$ | | $3.6 \times 10^{-4}$ |

TABLE V compares the 193 nm absorption cross-sections and transmission various species in silica.

TABLE V

| Defect/Impurity | ABS Cross-Section at 193 nm ($cm^2$) | 193 nm Transmission Penalty (%/cm) (per ppb by mol) |
|---|---|---|
| SiE' | $5.9 \times 10^{-18}$ | 0.03 |
| $O_2$ | $1.2 \times 10^{-20}$ | $6.0 \times 10^{-5}$ |
| OH | Below detection limit | Below detection limit (per ppb by wt) |
| Ti | $4.4 \times 10^{-18}$ | 0.028 |
| Na | $5.2 \times 10^{-19}$ | 0.0069 |
| Cl | $8.5 \times 10^{-23}$ | $7.3 \times 10^{-7}$ |

It will be apparent to those skilled in the art that various modifications and alterations can be made to the present invention without departing from the scope and spirit of the invention. Thus, it is intended that the present invention cover the modifications and variations of this invention provided they come within the scope of the appended claims and their equivalents.

What is claimed is:

1. A process for making a synthetic glass material with an OH concentration from 0.1 to 1300 ppm by weight with a variation in OH concentration in a direction perpendicular to at least one axis thereof of less than 20 ppm by weight, comprising the following steps:
   (i) providing silica soot particles;
   (ii) forming a porous preform having bulk density of 0.2 to 1.6 g/cm$^3$ from the soot particles;
   (iii) optionally purifying the porous preform; and
   (iv) consolidating the preform into dense silica glass by heating the preform to a temperature of at least 1200° C. in the presence of H$_2$O and/or O$_2$ in a furnace having an internal surface that is inert to H$_2$O and O$_2$ when exposed to a consolidation atmosphere, wherein the dense silica glass has an OH concentration from 0.1 to 1300 ppm by weight with a variation in OH concentration in a direction perpendicular to at least one axis thereof of less than 20 ppm by weight and an internal transmission of at least 99.65%/cm at 193 nm.

2. A process in accordance with claim 1, wherein in step (ii), the formed porous preform has a bulk density between 0.25 to 1.0 g/cm$^3$.

3. A process in accordance with claim 2, wherein in step (ii), the formed porous preform has a local soot density variation of less than 20%, or less than 0.2 g/cm$^3$, whichever is greater, of the bulk density of the porous preform over a distance of 0.2 mm, wherein the distance is measured in a plane perpendicular to an intended optical axis of the porous preform before consolidating.

4. A process in accordance with claim 3, wherein in step (ii), the formed porous preform has a local soot density variation of less than 10% of the bulk density of the soot preform, or less than 0.1 g/cm$^3$, whichever is greater, over a distance of greater than 0.2 mm, wherein the distance is measured in a plane perpendicular to an intended optical axis of the porous preform before consolidating.

5. A process in accordance with claim 1, wherein in step (iv), the preform is subjected to a temperature elevation rate of less than 0.4° C./minute between 1150-1450° C.

6. A process in accordance with claim 1, wherein in step (i), organosilicon precursor compounds essentially free of chlorine are used in providing the silica soot particles.

7. A process in accordance with claim 1, wherein in step (i), the silica soot particles are provided by flame hydrolysis of least one precursor compound, wherein the at least one precursor compound includes SiCl$_4$.

8. A process in accordance with claim 1, wherein in step (iii), purifying comprises treatment by a purification agent that is essentially free of chlorine.

9. A process in accordance with claim 1, wherein in step (iv), the preform is subjected to a temperature elevation rate of less than 0.4° C./minute between 1000-1600° C.

10. A process in accordance with claim 1, wherein in step (iv), the preform is subjected to a temperature elevation rate of less than 0.2° C./minute between 1150-1450° C.

11. A process in accordance with claim 1, wherein in step (iv), the preform is first isothermally held at a temperature between 1150° C. and 1300° C. for at least one hour prior to final densification.

12. A process in accordance with claim 11, wherein in step (iv), the preform is first isothermally held at a temperature between 1150° C. and 1300° C. for more than 5 hours, but less than 200 hours.

13. A process in accordance with claim 1, wherein in step (iv), the preform is consolidated in an atmosphere comprising helium and/or He/H$_2$O and/or He/H$_2$O/O$_2$.

14. A process in accordance with claim 1, wherein in step (iv), the preform is consolidated in an atmosphere comprising less than 1% by volume of O$_2$.

15. A process in accordance with claim 14, wherein in step (vi), the preform is consolidated in an atmosphere comprising less than 0.4% by volume of O$_2$.

16. A process in accordance with claim 1, wherein in step (iv), the preform is consolidated in an atmosphere comprising H$_2$O.

17. A process in accordance with claim 16, wherein the consolidation atmosphere has a partial pressure of H$_2$O of between about 0.0005 to 760 torr, balance inert gas.

18. A process in accordance with claim 17, wherein the partial pressure of H$_2$O in the consolidation atmosphere is between 0.05 and 100 torr, balance inert gas.

19. A process in accordance with claim 1, wherein in step (iv), the preform is subjected to an atmosphere containing O$_2$ at least before the temperature is elevated to 1200° C.

20. A process in accordance with claim 1, wherein in step (iv), the preform is consolidated in an environment substantially inert to O$_2$/H$_2$O.

21. A process in accordance with claim 20, wherein the preform is consolidated in the furnace, wherein the furnace has a muffle constructed from silica, alumina, zirconia, SiN or SiC or combinations thereof.

22. A process in accordance with claim 1, wherein in step (ii), the preform is formed axially on a rotating support.

23. A process in accordance with claim 1, wherein step (ii) comprises the following steps:
   (A) depositing the soot particles axially on a rotating support to form a cylinder having a cladding layer formed of the soot particles;
   (B) removing the support from the cylinder to leave the cladding layer, which forms the preform.

24. A process in accordance with claim 23, further comprising the following step (v) after step (iv):
   (v) at least one of cutting, rolling and sagging the dense silica glass into planar form.

25. A process in accordance with claim 1, wherein in step (ii), the soot preform is formed by directly depositing the soot particles provided in step (i) onto a planar surface of a rotating substrate.

26. A process in accordance with claim 1, wherein in step (i), the soot is provided by using a silicon precursor material free of chlorine.

27. A process in accordance with claim 1, wherein in step (iii), the soot preform is purified in the presence of an atmosphere substantially free of chlorine.

28. A process in accordance with claim 26, wherein in step (iii), the soot preform is purified in the presence of an atmosphere substantially free of chlorine.

29. A synthetic silica glass material with an OH concentration from 0.1 to 1300 ppm by weight with a variation in OH concentration in a direction perpendicular to at least one axis thereof of less than 20 ppm by weight, and an internal transmission at 193 nm of at least 99.65%/cm.

30. A synthetic silica glass material in accordance with claim 29 having an internal transmission at 193 nm of at least 99.75%/cm.

31. A synthetic silica glass material in accordance with claim 29 having an internal transmission at 193 nm of at least 99.80%/cm.

32. A synthetic silica glass material in accordance with claim 29 further comprising between $1\times10^{15}$ to $5\times10^{18}$ molecules/cm$^3$ $H_2$.

33. A synthetic silica glass material in accordance with claim 29 further comprising less than 50 ppm by weight of Cl.

34. A synthetic silica glass material in accordance with claim 29 with an OH concentration between 0.1-100 ppm by weight.

35. A synthetic silica glass material in accordance with claim 29 comprising less than 10 ppb alkali, alkaline earth, or transition metal elements.

36. A synthetic silica glass material in accordance with claim 35 comprising less than 1 ppb alkaline earth or transition metal elements.

37. A synthetic silica glass material in accordance with claim 29 having a fictive temperature between 800-1200° C. and less than 50° C. variation in fictive temperature.

38. A synthetic silica glass material in accordance with claim 29 having a fictive temperature between 800-1200° C. and less than 10° C. variation in fictive temperature.

39. A synthetic silica glass material in accordance with claim 29 having refractive index variation of less than 5 ppm.

40. A synthetic silica glass material in accordance with claim 29 having birefringence less than 2 ppm.

41. A synthetic silica glass material in accordance with claim 29 further comprising fluorine.

42. A synthetic silica glass material in accordance with claim 29, comprising striae perpendicular to the axis.

43. An optical glass member consisting essentially of the synthetic silica glass material in accordance with claim 29, having an optical axis parallel to the axis perpendicular to which the silica glass material has a variation of OH concentration of less than 20 ppm by weight.

44. An optical glass member in accordance with claim 40 for use in lithography at wavelengths shorter than about 250 nm.

45. A synthetic silica glass material in accordance with claim 29, comprising $O_2$ in an amount less than $7.5\times10^{16}$ molecules $O_2$/cm$^3$.

46. A synthetic silica glass material in accordance with claim 29, comprising $O_2$ in an amount less than $3.7\times10^{16}$ molecules $O_2$/cm$^3$.

47. A synthetic silica glass material in accordance with claim 29, comprising $O_2$ in an amount less than $1.8\times10^{16}$ molecules/cm$^3$.

* * * * *